(12) United States Patent
Välisuo et al.

(10) Patent No.: US 8,531,193 B2
(45) Date of Patent: Sep. 10, 2013

(54) METHOD AND DEVICE FOR CAPACITIVE DETECTION OF OBJECTS

(75) Inventors: Petri Välisuo, Vaasa (FI); Juhani Virtanen, Tampere (FI); Kari Kymäläinen, Tampere (FI); Laurentiu Barna, Tampere (FI); Jarkko Mäkiranta, Siuro (FI)

(73) Assignee: Marimils Oy, Vantaa (FI)

( * ) Notice: Subject to any disclaimer, the term of this patent is extended or adjusted under 35 U.S.C. 154(b) by 603 days.

(21) Appl. No.: 12/668,569

(22) PCT Filed: Jun. 19, 2008

(86) PCT No.: PCT/FI2008/050379
§ 371 (c)(1),
(2), (4) Date: Jul. 12, 2010

(87) PCT Pub. No.: WO2009/007500
PCT Pub. Date: Jan. 15, 2009

(65) Prior Publication Data
US 2010/0283485 A1    Nov. 11, 2010

Related U.S. Application Data

(60) Provisional application No. 60/929,748, filed on Jul. 11, 2007.

(51) Int. Cl.
*G01R 27/26*    (2006.01)
(52) U.S. Cl.
USPC .......................................................... 324/663
(58) Field of Classification Search
USPC .................. 324/663, 671, 678, 686
See application file for complete search history.

(56) References Cited

U.S. PATENT DOCUMENTS

| | | | | |
|---|---|---|---|---|
| 3,400,331 | A  * | 9/1968 | Harris | 324/671 |
| 5,730,165 | A | 3/1998 | Philipp | |
| 6,362,632 | B1 | 3/2002 | Livingston | |
| 6,407,556 | B1 | 6/2002 | Rudeke | |
| 6,466,036 | B1 * | 10/2002 | Philipp | 324/678 |
| 6,661,410 | B2 * | 12/2003 | Casebolt et al. | 345/173 |

(Continued)

OTHER PUBLICATIONS

PCT/ISA/210—International Search Report—Oct. 8, 2008.

(Continued)

*Primary Examiner* — Jermele M Hollington
*Assistant Examiner* — Demetrius Pretlow
(74) *Attorney, Agent, or Firm* — Venable LLP; Eric J. Franklin

(57) ABSTRACT

Proximity of a person causes a change in a capacitance value of a sensor capacitor having a pair of capacitive plates. The change is detected by charging the sensor capacitor by coupling the sensor to a voltage supply. The supply is disconnected from a tank capacitor during the charging. The charge is transferred from the sensor capacitor to a tank capacitor. The supply is disconnected from the tank capacitor during the charge transfer. The charging and charge transfer are repeated several times. The voltage of the tank capacitor is monitored. At least one value is determined which depends on the rate of change of the voltage of the tank capacitor. The capacitance of the tank capacitor may be several orders of magnitude higher than the capacitance of the sensor capacitor. The large tank capacitor acts as a part of a low-pass filter which effectively filters out signal noise.

20 Claims, 12 Drawing Sheets

(56) References Cited

U.S. PATENT DOCUMENTS

| | | | |
|---|---|---|---|
| 6,940,291 B1* | 9/2005 | Ozick | 324/658 |
| 7,188,530 B2* | 3/2007 | Pedersen et al. | 73/718 |
| 7,205,776 B2* | 4/2007 | Kinoshita et al. | 324/658 |
| 7,301,350 B2* | 11/2007 | Hargreaves et al. | 324/678 |
| 7,598,752 B2* | 10/2009 | Li | 324/657 |
| 7,804,307 B1* | 9/2010 | Bokma et al. | 324/663 |
| 8,089,288 B1* | 1/2012 | Maharita | 324/678 |
| 8,207,944 B2* | 6/2012 | Geaghan | 345/173 |
| 2003/0132763 A1* | 7/2003 | Ellenz | 324/663 |
| 2004/0145378 A1* | 7/2004 | Shoji et al. | 324/663 |
| 2006/0071774 A1* | 4/2006 | Brown et al. | 340/522 |
| 2006/0250142 A1* | 11/2006 | Abe | 324/663 |
| 2007/0096840 A1* | 5/2007 | Williams et al. | 331/179 |
| 2007/0176609 A1* | 8/2007 | Ely et al. | 324/678 |
| 2008/0111714 A1* | 5/2008 | Kremin | 341/33 |

OTHER PUBLICATIONS

T. Jun et al; "The research of a Si based MEMS Single Chip Integration", Jan. 31, 2007.

* cited by examiner

METHOD AND DEVICE FOR CAPACITIVE DETECTION OF OBJECTS

CROSS-REFERENCE TO RELATED APPLICATIONS

This application claims priority to U.S. provisional patent application 60/929,748 filed 11 Jul. 2007 and is the national phase under 35 U.S.C. §371 of PCT/FI2008/050379 filed 19 Jun. 2008.

The present invention relates to capacitive detection of objects, e.g. human beings.

BACKGROUND

Presence of bodies or objects may be detected by determining a change of capacitance between two plates. The presence of an object causes a change in the dielectric constant between the plates, which in turn causes a change in the capacitance formed by said two plates, when compared with a situation where the object is far away from said plates.

A capacitive sensor may be used e.g. to detect movements of people e.g. in an anti-theft alarm system.

The absolute value of the capacitance of a capacitive sensor is typically very small. Electro-magnetic noise coupled into the sensor and to a monitoring circuit makes it difficult to detect small changes in said capacitance.

It is known that the capacitance value of a capacitor may be measured by coupling said capacitor as a part of an RC-circuit, and by determining the time constant of said RC-circuit. The resistor and the capacitor are connected in series, and the capacitor is charged through the resistor, starting from a defined voltage. The charging time can be characterized with the time constant. The time constant of the circuit, formed by the capacitor and the resistor, is determined either by measuring the time until a predetermined voltage level is reached or by measuring the voltage after a predetermined loading time. When the time constant and the resistance are known, the capacitance can be calculated.

This method can be used in measuring the capacitance of a capacitive sensor. A problem of the method is that the energy of a measured signal is very low, if the measured capacitance is low. Therefore, it is difficult to attain sufficient precision by measuring the charging time or the voltage attained after a predetermined loading time. Furthermore, electromagnetic radiation can easily interfere with the measurement. In practice, the capacitance of the sensor is so low that the charging time is also short and cannot be measured accurately enough e.g. by using a low-cost micro controller. Furthermore, a measurement based on this principle does not contain any kind of low-pass filter, which allows aliased high-frequency noise to appear on top of the signal to be measured.

It is known that the capacitance value of a capacitor may be measured by coupling an alternating voltage to said capacitor, and by determining the impedance of said capacitor.

The capacitor resists alternating current flow due to its impedance. The impedance is inversely proportional to the capacitance in a frequency domain. The impedance of the unknown capacitor can be compared with the impedance of a known capacitor by using, for example, a bridge comparison circuit, such as the Wheatstone bridge. This method requires complicated circuits and is therefore expensive.

It is known that changes in the capacitance value of a capacitor may be detected by coupling said capacitor as a part of a tuned oscillation circuit.

A capacitive sensor arrangement may comprise a resonance circuit composed of an unknown sensor capacitor and a known coil (inductance). When the capacitance of the sensor capacitor reaches a defined value, the circuit starts to resonate and the amplitude of the oscillation increases suddenly. It can be easily measured whether the circuit is resonating or not. This method is extremely sensitive, but only in a certain narrow capacitance range. When a wider range is required, this method is not practicable.

SUMMARY

The object of the invention is to provide a device and a method suitable for capacitive detection of objects.

The presence of an object changes the capacitance of a capacitive sensor, i.e. a sensor capacitor, when compared with a situation when the object is far away. Movement of an object in the vicinity of the capacitive sensor changes the capacitance of the sensor capacitor.

According to a first aspect of the invention, there is provided a device for capacitively detecting an object, said device comprising:
  a capacitive sensor having a sensor capacitor formed between at least one first capacitive element and at least one second capacitive element such that the presence of said object can change the capacitance of said sensor capacitor,
  a voltage supply,
  a first switch to couple said sensor capacitor to said voltage supply in order to charge said sensor capacitor,
  a tank capacitor,
  a second switch to couple said sensor capacitor to said tank capacitor in order to transfer charge from said sensor capacitor to said tank capacitor and to change the voltage of said tank capacitor,
  at least one switch driver unit to control said charging and charge transfer by opening and closing said switches several times such that said switches are not in the closed state simultaneously,
  a voltage monitoring unit to monitor the voltage of said tank capacitor, and
  a controller to determine at least one measurement value which depends on the rate of change of the voltage of said tank capacitor.

According to a second aspect of the invention, there is provided a method for capacitively detecting an object by using a capacitive sensor having a sensor capacitor formed between at least one first capacitive element and at least one second capacitive element such that the presence of said object can change the capacitance value of said sensor capacitor, said method comprising:
  charging said sensor capacitor by coupling it to a voltage supply, wherein said voltage supply is disconnected from a tank capacitor during said charging,
  transferring charge from said sensor capacitor to a tank capacitor, wherein said voltage supply is disconnected from said tank capacitor during said charge transfer,
  repeating said charging and charge transferring several times,
  monitoring the voltage of said tank capacitor, and
  determining at least one measurement value which depends on the rate of change of the voltage of said tank capacitor.

The unknown capacitance of the sensor capacitor is determined by a measuring circuit according to the invention. According to the invention, a known tank capacitor is charged by transferring charge several times from a voltage supply to said tank capacitor by using the sensor capacitor. Charging increases the voltage of said tank capacitor at a rate which is proportional to the capacitance of the sensor capacitor. Movement of the object may be detected by comparing a first rate of change with a second rate of change, which was measured earlier. If the rate of change of the voltage of the tank capacitor is increased, it may be determined that an object has moved closer to the capacitive sensor. A change in the rate of change (second derivative) of said voltage indicates that an object has moved in the vicinity of the capacitive sensor.

The voltage of the sensor capacitor represents a low-energy signal, and the voltage of the tank capacitor represents a high-energy signal. Transferring charge to a larger known capacitor by the smaller sensor capacitor makes it possible to integrate the low energy signal into the high energy signal before e.g. analog-to-digital conversion. Consequently, the sensitivity of the measuring device to electromagnetic interferences is considerably reduced.

Operating parameters of the measuring device may also be optimized so as to optimize resolution, measurement range, and/or data acquisition rate. Said operating parameters may also be adjusted by software.

The measuring device inherently comprises a low pass filter, which is formed from the smaller sensor capacitor, a charge-transferring switch and the larger tank capacitor. Said low-pass filter effectively attenuates noise cause by high frequency interference.

It is known that small capacitances may be measured accurately by using dangerously high voltages, e.g. in the order of 100 V or higher. Thanks to the invention, changes in the capacitance may be accurately monitored by using lower voltages, e.g. 24 V or less.

The embodiments of the invention and their benefits will become more apparent to a person skilled in the art through the description and examples given herein below, and also through the appended claims.

BRIEF DESCRIPTION OF THE DRAWINGS

In the following examples, the embodiments of the invention will be described in more detail with reference to the appended drawings, in which

FIG. 12b shows a cross-sectional view of the web of FIG. 12a,

All drawings are schematic.

DETAILED DESCRIPTION

Figure 1:
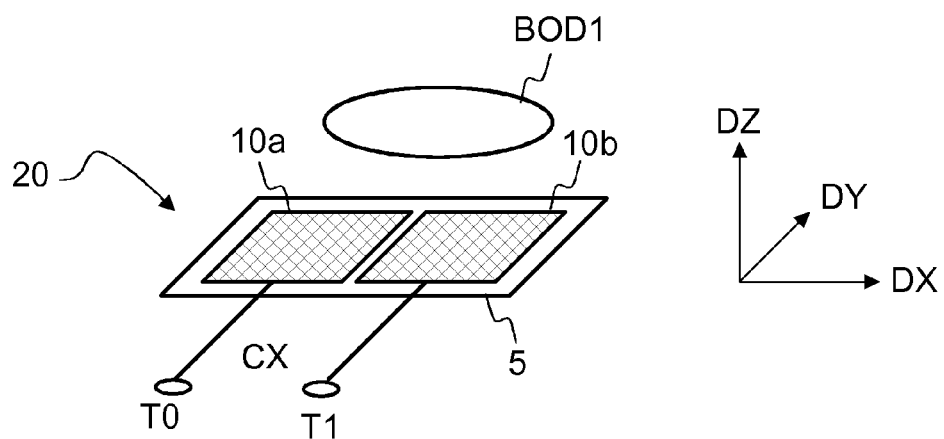
FIG. 1 shows, in a three-dimensional view, a capacitive proximity sensor.

Referring to FIG. 1, a capacitive sensor 20 may comprise a first conductive element 10a, and a second conductive element 10b. The elements 10a, 10b are electrically insulated from each other. The elements 10a, 10b may have any form. One or both elements 10a, 10b may be conductive structures consisting of several parts. Electric ground or earth may also be used as a conductive element 10a or 10b (see FIG. 14b). The first element 10a has a connecting terminal T0 and the second element has a connecting terminal T1.

Advantageously, the elements 10a, 10b are plates. The plates 10a, 10b may be disposed in or on an electrically insulating substrate 5.

The plates 10a, 10b form a capacitive system together with the medium located between said plates 10a, 10b. Said capacitive system CX has a capacitance value CX. For simplicity, the symbol CX is herein used to refer to the physical entity (capacitor) as well as to the measurable quantity (capacitance).

The presence of an object BOD1 in the vicinity of the sensor 20 changes the dielectric permittivity of the medium between the plates 10a, 10b. Thus, the presence of the object BOD1 changes the capacitance CX, when compared with a situation when the object BOD1 is far away from the sensor 20.

The capacitance CX depends on the distance between the object BOD1 and the sensor 20, as well as on the material, size and form of the object BOD1. Thus, said capacitive system CX represents an unknown capacitor.

The capacitance CX may be e.g. smaller than or equal to 5 nF when the object BOD1 is far away from the sensor 20, or even smaller than or equal to 1 nF in order to improve spatial resolution. A small area of the plates 10a, 10b may be needed to ensure sufficient spatial resolution.

The dielectric permittivity of the object typically deviates from the dielectric permittivity of air. Typically, the presence of the object BOD1 increases the capacitance CX. Also the presence of a conductive object BOD1 increases the capacitance CX. This is because an electrically conductive object can be understood to have a substantially infinite dielectric permittivity.

Figure 12A:
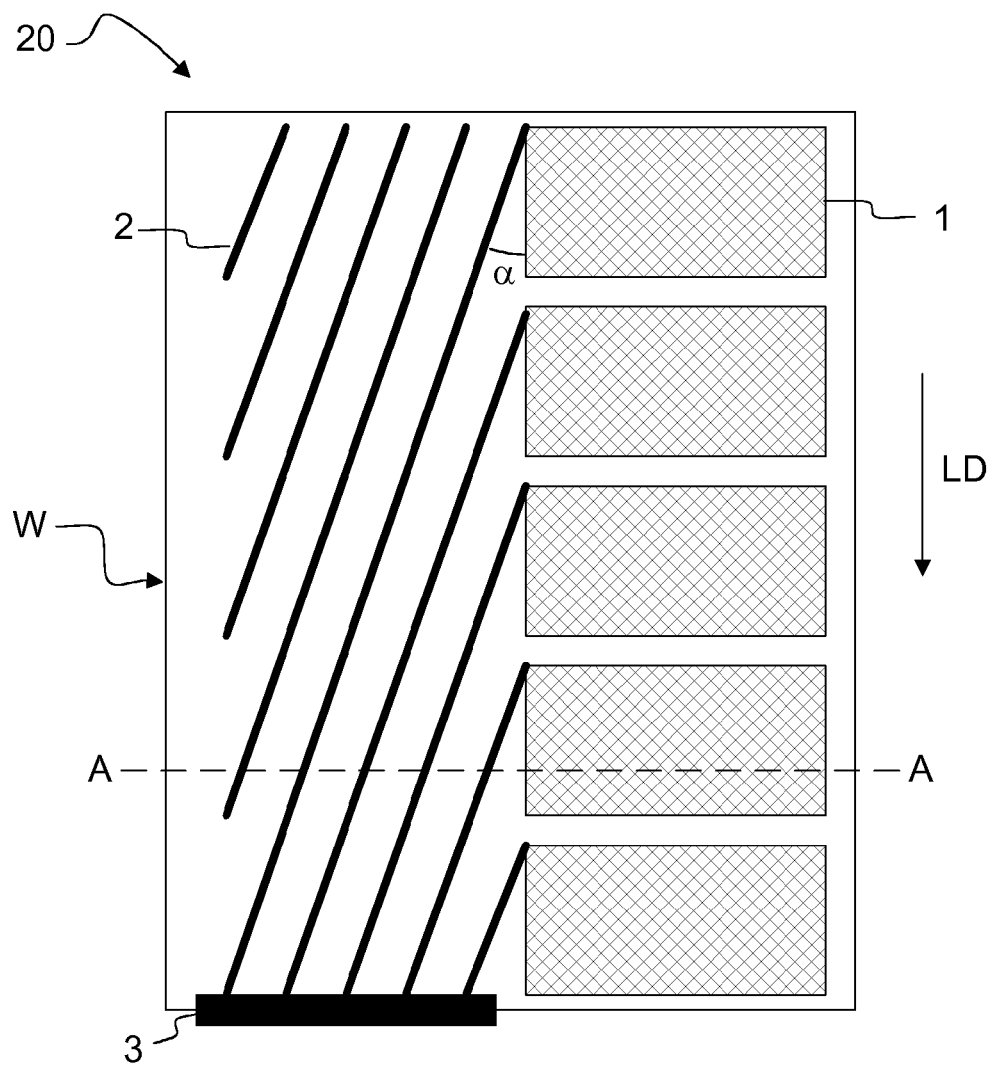
FIG. 12a shows, in a top view, a sensor web
Figure 12B:
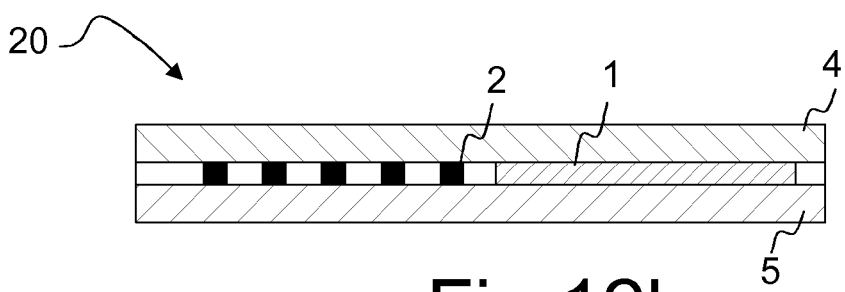

The sensor 20 may comprise an electrically insulating layer (see e.g. FIG. 12b to prevent electric contact between the plates 10a, 10b and the object BOD1.

For an optimum spatial resolution and signal-to-noise ratio, the size of the plates 10a, 10b may be in the same order of magnitude as the size of the object BOD1 to be detected. If the object BOD1 is e.g. the foot of a person, the dimensions of the plate 10a may be e.g. in the range of 3 to 30 cm in the directions DX and DY.

DX, DY and DZ are orthogonal directions. The substrate 5 may be in a plane defined by the directions DX and DY.

Figure 2:
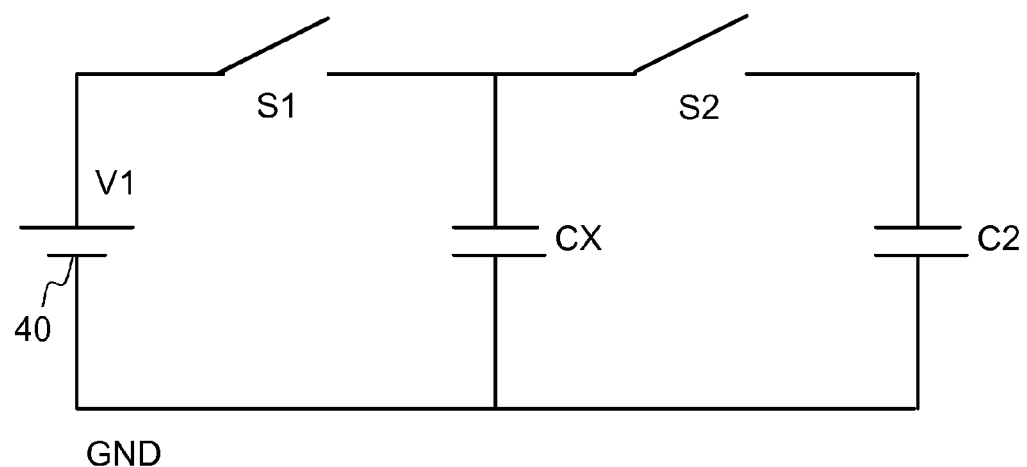
FIG. 2 shows a schematic diagram of the switched capacitor measurement circuit according to the invention.

Referring to FIG. 2, a switched capacitor circuit is a circuit, which comprises a capacitor connected between two switches so that the capacitor is alternately charged and discharged. This kind of a circuit acts like a resistor.

FIG. 2 shows a switched capacitor circuit, which comprises the unknown sensor capacitance CX, a first switch S1, a second switch S2, and a voltage supply 40. The voltage supply provides a voltage V1. The switches S1 and S2 are opened and closed at a switching frequency $f_{SW}$ in such a way that the switches S1, S2 are not in the closed state simultaneously. For example, the first switch may be in the closed (conducting) state when the second switch S2 is in the open (non-conducting) state, and vice versa.

A voltage supply 40 provides a voltage V1. Closing of the switch S1 transfers charge to the sensor capacitor CX. Opening of the switch S1 and closing the switch S2 transfers the charge from the sensor capacitor CX to the tank capacitor C2. Opening and closing of the switches S1, S2 alternately several times increases the voltage of the tank capacitor C2 in a stepwise manner. The switching may be continued e.g. until a predetermined voltage over the tank capacitor C2 is attained.

Figure 3:
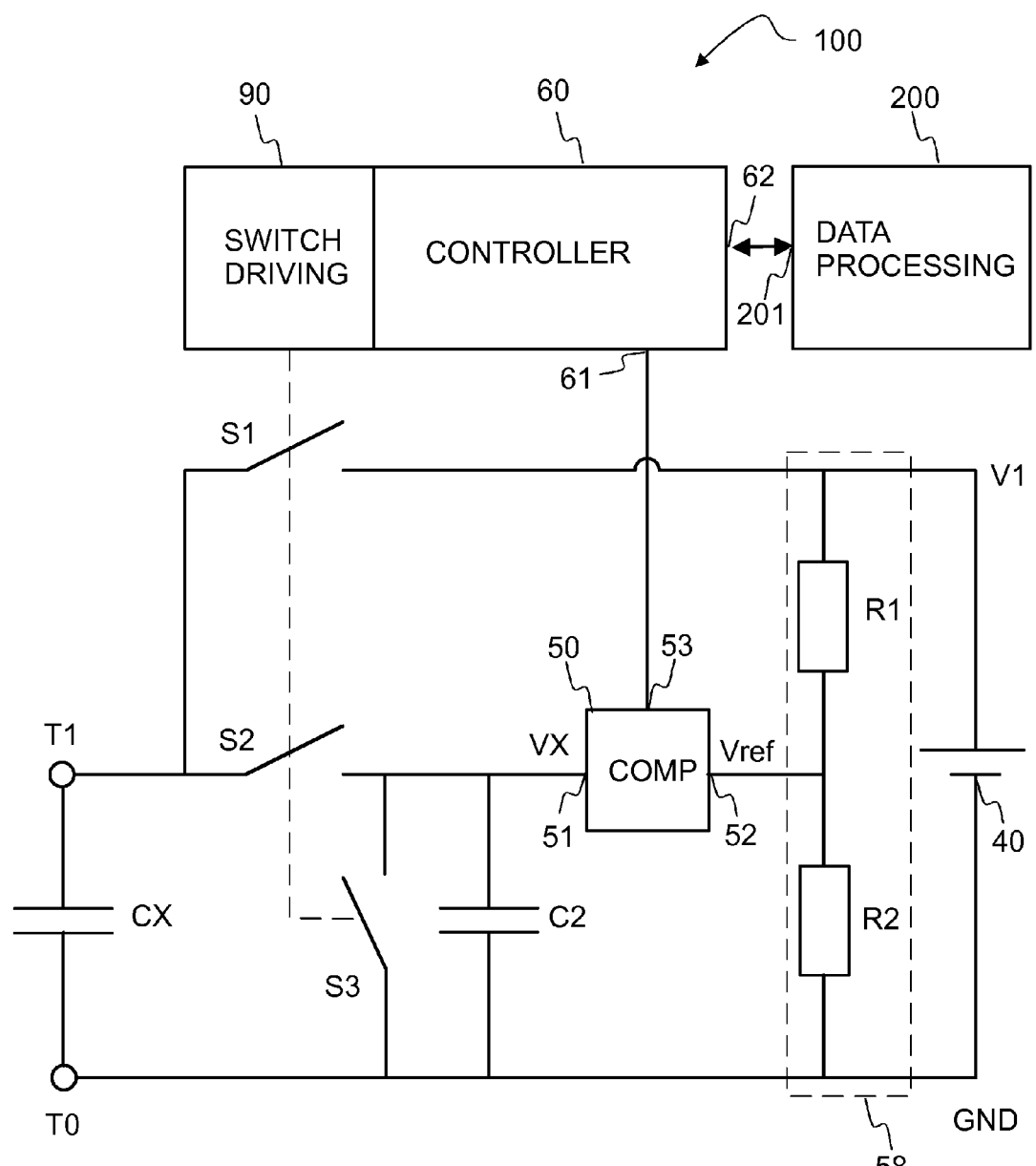
FIG. 3 shows the circuit diagram of a capacitance measuring device comprising a voltage comparator.

FIG. 3 shows a proximity detecting device 100, which may comprise a capacitive proximity sensor 20, switches S1, S2, S3, a tank capacitor C2, a voltage supply 40, a reference voltage source 58, a comparator 50, and a controller 60. The voltage supply 40 provides a voltage V1. The capacitive sensor 20 is represented by the sensor capacitor CX.

The first node of the voltage source 40 is coupled to the first terminal T0 of the sensor capacitor CX. The second node of the voltage source 40 is coupled to the second terminal T1 of the sensor capacitor CX by the switch S1. Thus, the sensor capacitor CX may be charged to the voltage V1 of the supply 40.

The terminal T0 may also be connected to the ground GND, e.g. to the earth. However, this is not always necessary.

First, the tank capacitor C2 may be discharged by closing the switch S3. The switch S3 is subsequently opened and kept in the open state.

The sensor capacitor CX is now charged by closing the switch S1, while the switch S2 is in the open state. Then, the switch S1 is opened and charge is transferred from the sensor capacitor CX to the tank capacitor C2 by closing the switch S2. The transferred change increases the voltage VX over the tank capacitor by a small amount.

The capacitance of the tank capacitor C2 may be e.g. greater than or equal to 10 times the minimum capacitance value of the sensor capacitor CX, preferably greater than or equal to 100 times the capacitance value of said sensor capacitor CX.

The voltage VX of the tank capacitor is increased by closing and opening the switches S1 and S2 consecutively several times until the voltage VX reaches or exceeds the reference voltage Vref provided by the reference voltage source 58.

The voltages VX and Vref may be coupled to inputs 51, 52 of a comparator 50. The output 53 of the comparator 50 may be coupled to an input 61 of the controller 60.

The controller 60 may be arranged to discharge the tank capacitor C2 by closing the switch S3 when the state of the comparator output 53 is changed.

The controller 60 may be arranged to discharge the tank capacitor C2 by closing the switch S3 after a predetermined time from the change of state of the comparator output 53.

The switches S1, S2, S3 may be controlled by at least one switch driving unit 90, which may be a separate component or incorporated in the controller 60.

The controller 60 may be arranged to count the number $N_k$ of charge transfer cycles, i.e. closing times of the switch S2 needed to change the state of the comparator output. The controller 60 may be arranged to send the number $N_k$ to an external data processing device 200 via terminals 62, 201.

The number $N_k$, or further information dependent on said counted number $N_k$, represents a measurement result.

Said further information may be e.g. a time constant, a time period $T_k$ needed for the tank capacitor voltage CX to reach a predetermined voltage, a voltage VX of the tank capacitor C2 attained after a predetermined time period $T_{FIX}$, the absolute value of the sensor capacitor CX, a change of the capacitance of the sensor capacitor CX when compared with its previous value, or a relative change (e.g. +1%) of the capacitance of the sensor capacitor CX when compared with its previous measured value.

Data acquisition rate of the proximity detecting device 100 means the number of independent capacitance values CX measured per unit time. Switching frequency means the number of closing cycles of the second switch S2 per unit time. The switching frequency may be by several orders of magnitude higher than the data acquisition rate.

The reference voltage Vref may be lower than or equal to 30% of the voltage V1 of the voltage supply 40 so as to provide a substantially linear relationship between the count number $N_k$ and the capacitance value CX.

The reference voltage source 58 may comprise e.g. a voltage divider formed by resistors R1 and R2. An advantage of the voltage divider is that the measurement result is substantially independent of the absolute voltage V1. Also a reference voltage supply based on e.g. a Zener diode may be used.

The data processing device 200 may be e.g. a computer of a surveillance system.

The absolute value of the unknown sensor capacitance CX may be determined by the device 100. The absolute value CX of the sensor capacitance may be calculated based on the known values of tank capacitance C2, on the known switching frequency, and on the known ratio between the voltage VX of the tank capacitor C2 and the voltage V1 of the voltage supply 40.

An even more accurate calculation can be made when the impedances (resistivity and capacitance) of the switches S1 and S2 are taken into account.

The capacitance values CX determined by calculation may be made even more accurate by calibration, e.g. by determining a calibration coefficient by coupling a known capacitor to the terminals T0 and T1.

However, in many cases it is not needed to determine the absolute value of the sensor capacitance CX. The device 100 may be arranged to detect a change in the sensor capacitance CX. The change may be determined as a relative change, e.g. 1% increase when compared with a previous measured value.

The switching frequency and/or the capacitance C2 may be adjustable in order to optimize data-acquisition rate, accuracy and/or resolution. E.g. the controller 60 may be arranged to make said adjustment based on a previous measured value. The data-acquisition rate, accuracy and/or resolution may be adjusted by software.

The capacitance C2 may be adjusted e.g. by coupling a further capacitor in parallel by a further switch.

Figure 4:
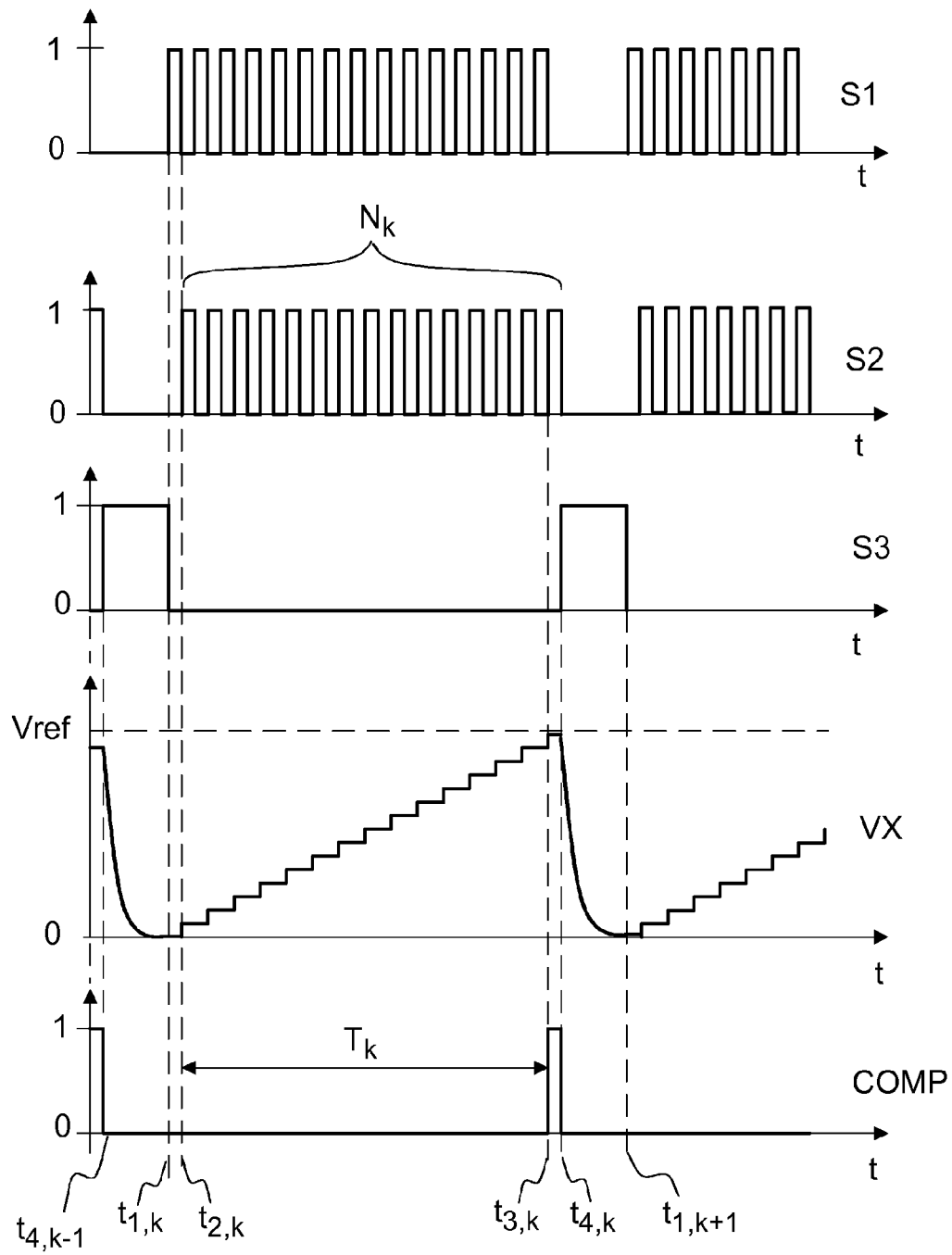
FIG. 4 shows a timing chart for the device of FIG. 3.

FIG. 4 shows the timing chart for the device of FIG. 3. The first, the second, the third, and the fifth curve from the top show the logical states of the switches S1, S2, S3 and the comparator output, respectively. The fourth curve from the top shows the temporal evolution of the voltage VX of the tank capacitor.

The switch S3 is closed at the time $t_{4,k-1}$ in order to discharge the tank capacitor C2. The switch S3 may be kept closed for a predetermined time in order to ensure that the tank capacitor C2 is discharged to a sufficient degree.

t denotes time. k is an integer which indicates the index of a currently measured result. The logical state 0 denotes an open switch and the logical state 1 denotes a closed switch. At least one of the switches S1, S2 should be open during discharging of the tank capacitor C2.

The switch S3 is opened at the time $t_{1,k}$ and the sensor capacitor CX is charged by closing the switch S1. S2 is kept in the open state. The switch S1 is opened at the time $t_{2,k}$ and the switch S2 is closed in order to transfer charge from the sensor capacitor CX to the tank capacitor C2. The switches S1 and S2 are opened and closed several times alternately until the voltage VX of the tank capacitor reaches or exceeds the reference voltage Vref.

The voltage VX of the tank capacitor becomes equal to the reference voltage Vref at the time $t_{3,k}$.

The switch S3 is closed at the time $t_{4,k}$ in order to discharge the tank capacitor C2 again.

The time period $T_k$ between the times $t_{2,k}$ and $t_{3,k}$ is proportional to the count number $N_k$, i.e. the number of consecutive opening and closing cycles of the switches S1, S2 needed to attain the reference voltage level $V_{ref}$. The length of the time period $T_k$, or the corresponding count number $N_k$ represents a measurement result.

A new charging and charge transfer sequence by using the switches S1 and S2 is started again at the time $t_{1,k+1}$ in order to determine the next count number $N_{k+1}$ and/or the next time period $T_{k+1}$.

Figure 5:
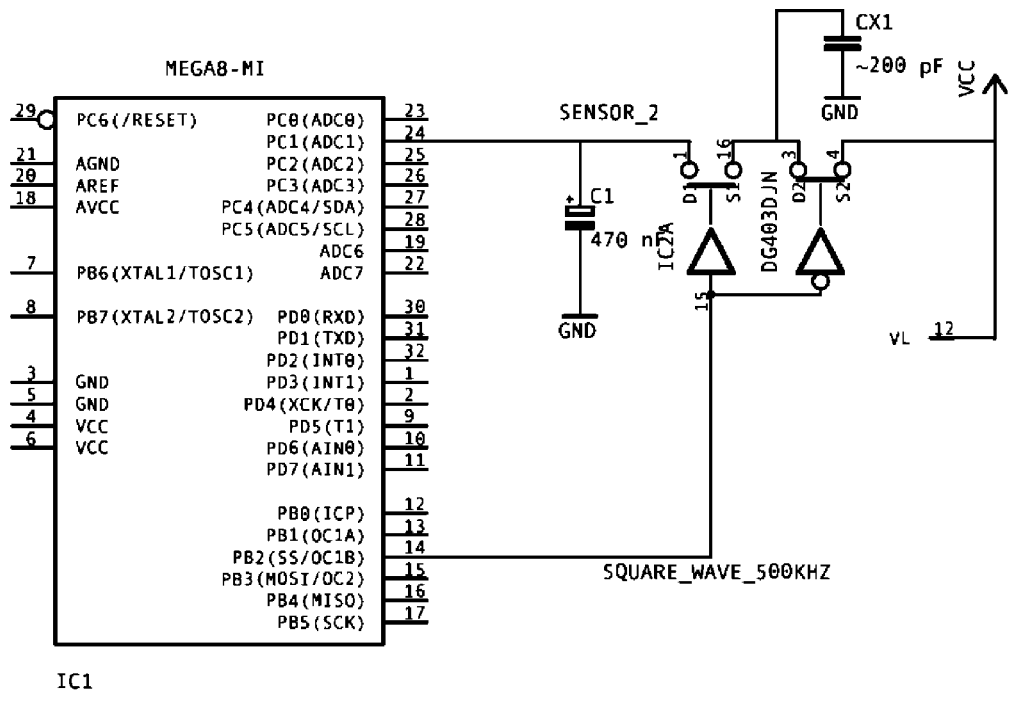
FIG. 5 shows the circuit diagram of a capacitance measuring device comprising an analog switching unit DG403DJ.

FIG. 5 shows an implementation of the device by using a microcontroller IC1 and an analogue semiconductor switching unit IC2A (DG403DJ). The switching unit is driven by a square wave signal coupled to an input 15 of the switching unit. The frequency of the driving signal may be e.g. 500 kHz. The switching unit comprises an internal inverter arranged to set the first switch to a different state than the second switch. The first switch is between terminals 3 (D2) and 4 (S2) of the switching unit. The second switch is between the terminals 1 (D1) and 16 (S1) of the switching unit.

The sensor capacitor CX1 is charged to the voltage VCC by the first switch. Next, the charge is transferred to the tank capacitor C1.

The capacitance of the sensor capacitor CX1 may be e.g. in the order of 200 pF. The capacitance of the tank capacitor C1 may be e.g. 470 nF.

12 (VL) denote the terminal of the voltage supply. GND denotes ground. "MEGA8-MI" is a trade mark of the microcontroller. The microcontroller has terminals marked by numbers 1-32. PC6(RESET), AGND, AREF, AVCC, PB6 (XTAL1/TOSC1), PB7(XTAL2/TOSC2), GND, GND, VCC, VCC, PC0(ADC0), PC1(ADC1), PC3(ADC3), PC4 (ADC4/SDA), PC5(ADC5/SCL), ADC6, ADC7, PD0 (RXD), PD1(TXD), PD2(INT0), PD3(INT1), PD4(XCK/T0), PD5(T1), PD6(AIN0), PD7(AIN1), PB0(ICP), PB1 (OC1A), PB2(SS/OC1B), PB3(MOSI/OC2), PB4(MISO), and PB5(SCK) are symbols referring to the functions of the terminals 1-32. The driving voltage is provided by the terminal 14 of the microcontroller, and the voltage of the tank capacitor is monitored by the terminal 24 of the microcontroller.

The signs for the terminals of the microcontroller should not be confused with the signs for other parts of the device as shown in FIGS. 1, 11, 12a, 12b, 14a, and 14b.

Figure 6:
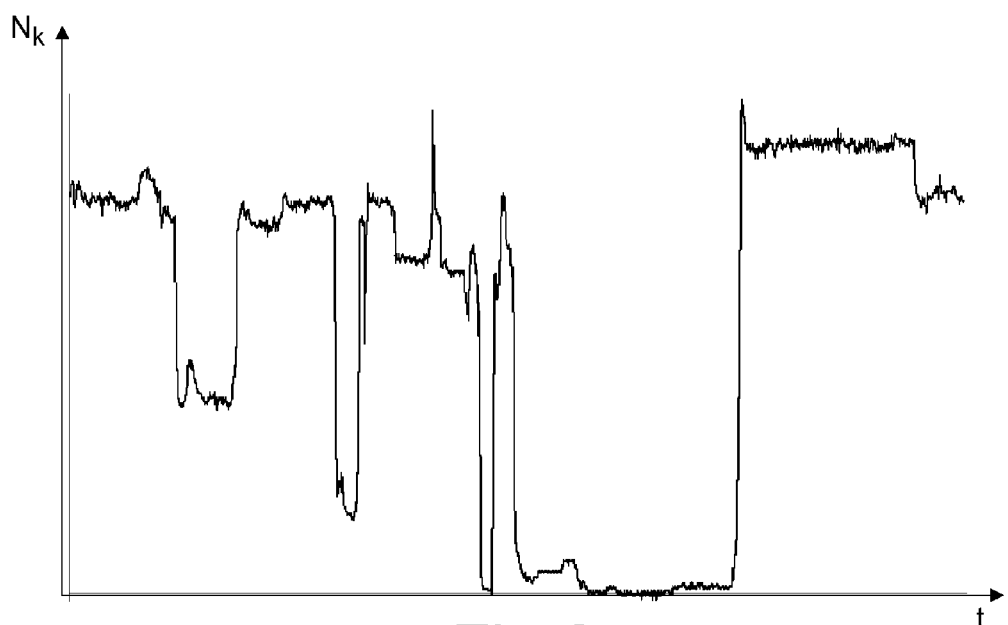
FIG. 6 shows, by way of example, an output of a measurement.

FIG. 6 shows, by way of example, temporal evolution of the determined counter value $N_k$ when an object BOD1 is positioned at different distances from the capacitive sensor 20. Lowest values are detected when the object is far away from the sensor.

The values were measured at a sampling frequency of 19.52 Hz. The smallest index value k of the determined values was 9670 and the largest 33991.

Figure 7A:
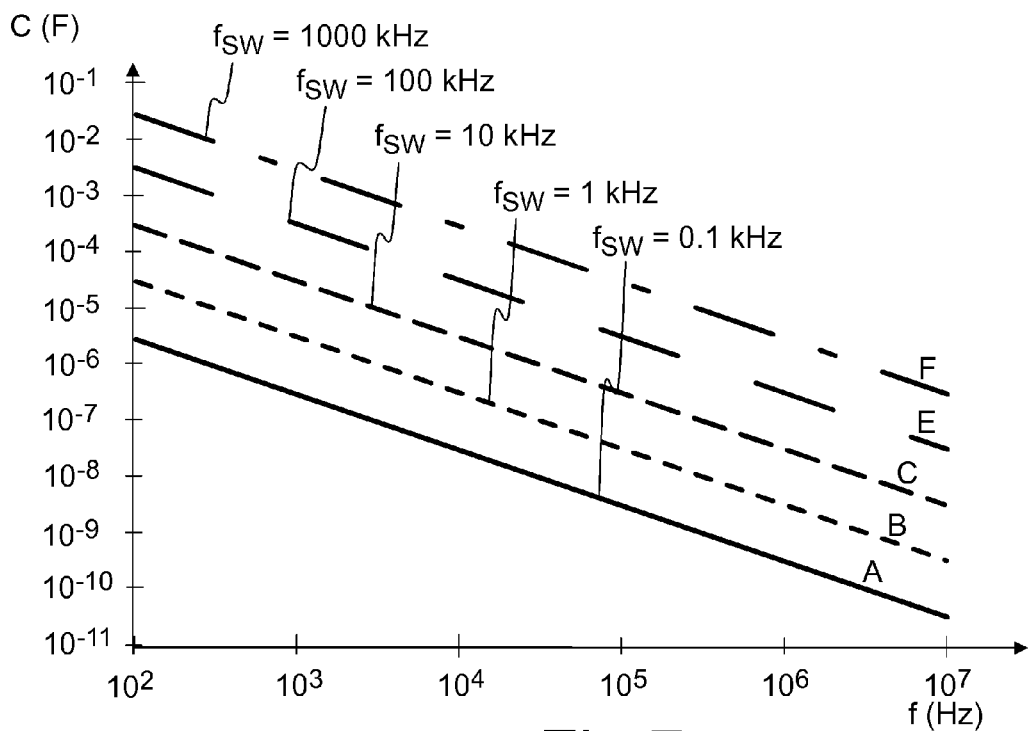
FIG. 7a shows, by way of example, possible choices of measurement parameters.

Referring to FIG. 7a, lines A, B, C, D, and E indicate possible relationships between sampling frequency f and suitable capacitance values of the tank capacitor C2 at a given switching frequency $f_{SW}$, when 12 bit resolution is desired for the measurement.

For example, when the switching frequency is 500 kHz and the clock rate of the microcontroller 60 is 8 MHz, a suitable value for the tank capacitor C2 could be e.g. 470 nF. The status of the comparator output or an A/D converter output may be examined (sampled) at the clock frequency of the microcontroller 60.

A larger tank capacitor C2 may be selected for a higher switching frequency $f_{SW}$, because the charge transferred per unit time is also larger at the higher switching frequency.

The sampling frequency may also be equal to the switching frequency. In that case the accuracy is limited by the switching frequency. When the switching frequency is e.g. 500 kHz, and resolution is 12 bits, it is possible to reach a sampling frequency (data acquisition rate) which is approximately equal to 120 Hz (=500 kHz/$2^{12}$).

The rate at which the comparator output is examined (sampling frequency) can also be higher than the switching frequency. The charge is not transferred from the sensor capacitor CX to the tank capacitor C2 infinitely fast. By using a sampling frequency which higher than the switching frequency, one can get more detailed information when the charge has been fully transferred from the sensor capacitor CX to the tank capacitor. Thus, the accuracy may be further improved. The sampling frequency may be e.g higher than or equal to two time the switching frequency. The sampling frequency may be e.g. an integer multiple of the switching frequency.

Figure 7B:
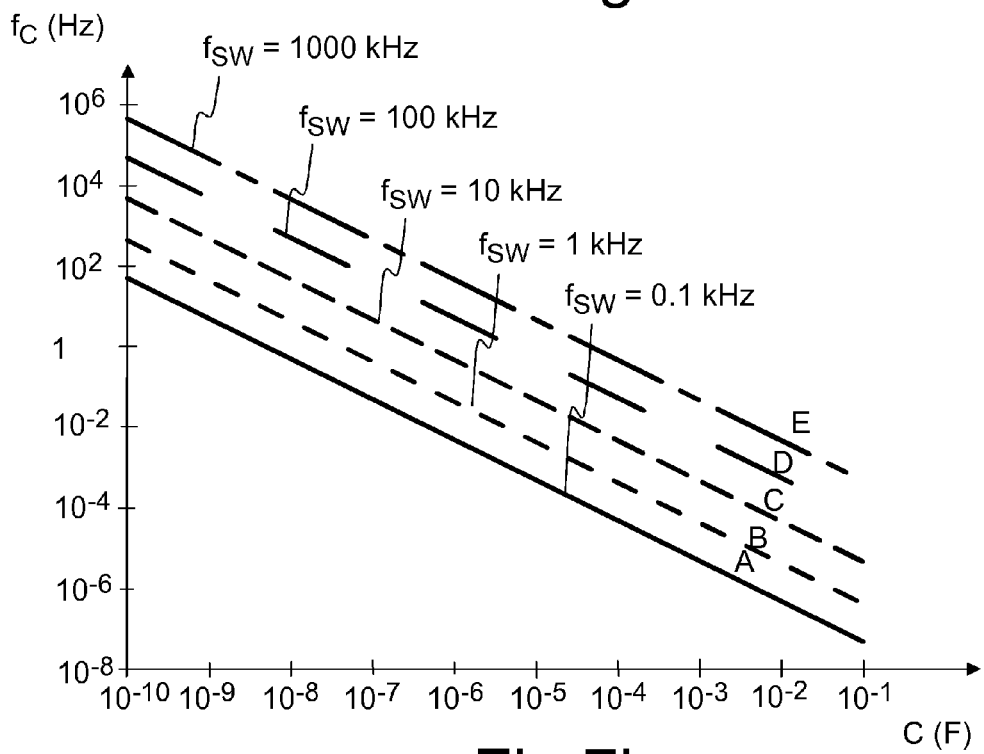
FIG. 7b shows the cut-off frequency for capacitance switching.

The switched capacitor CX and the tank capacitor C2 form together a low-pass filter capable of suppressing noise. Referring to FIG. 7b, lines A, B, C, D, and E indicate the relationship between the capacitance of the tank capacitor C2 and the cut-off frequency $f_C$ of said low-pass filter.

For effective noise rejection, it would be advantageous to select a low cut-off frequency $f_C$. However, the cut-off frequency $f_C$ also sets an upper limit for the data acquisition rate (number of independent capacitance values CX which can be measured per unit time). Therefore the cut-off frequency $f_C$ can not be selected.

For example, when the switching frequency is 500 MHz and C2=470 nF, then the cut-off frequency $f_C$ is approximately 100 Hz.

Figure 8:
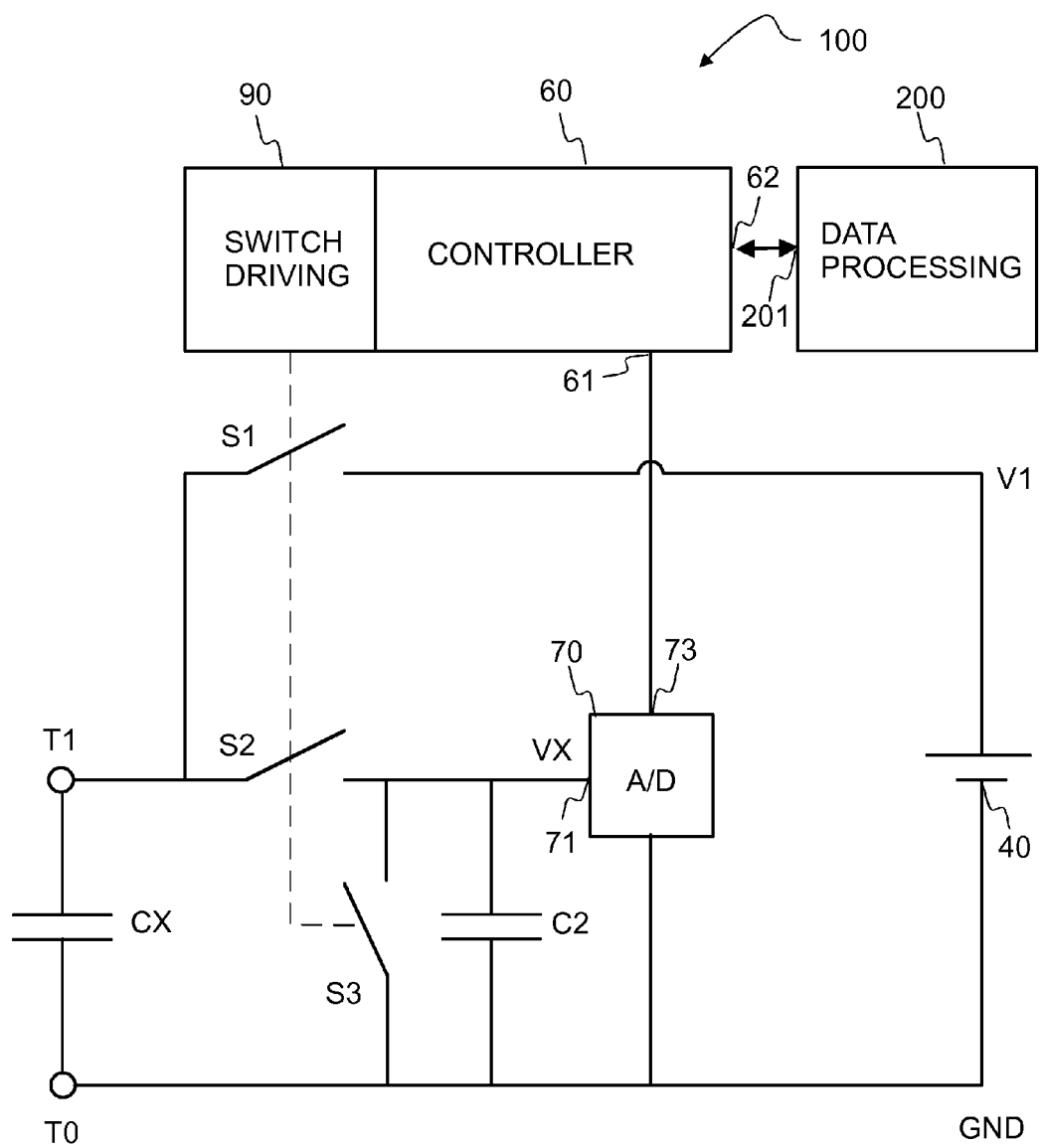
FIG. 8 shows the circuit diagram of a capacitance measuring device comprising an analog-to-digital converter.

FIG. 8 shows a proximity detecting device 100, which may comprise a capacitive sensor 20, switches S1, S2, S3, a tank capacitor C2, a voltage supply 40, a reference voltage source 58, an analog-to-digital (A/D) converter 70, and a controller 60.

The voltage supply 40 provides a voltage V1. The capacitive proximity sensor 20 is represented by the unknown sensor capacitance CX.

The first node of the voltage source 40 is coupled to the first terminal T0 of the sensor capacitor CX. The second node of the voltage source 40 is coupled to the second terminal T1 of the sensor capacitor CX by the switch S1. Thus, the sensor capacitor CX may be charged to substantially the voltage V1 of the supply 40.

The terminal T0 may also be connected to the ground GND. However, this is not always necessary.

First, the tank capacitor C2 may be discharged by closing the switch S3. Then, the switch S3 is opened and kept in the open state. The sensor capacitor CX is charged by closing the switch S1, while the switch S2 is in the open state. Then, the switch S1 is opened and charge is transferred from the sensor capacitor CX to the tank capacitor C2 by closing the switch S2. The transferred change increases the voltage VX over the tank capacitor by a small amount.

Figure 9:
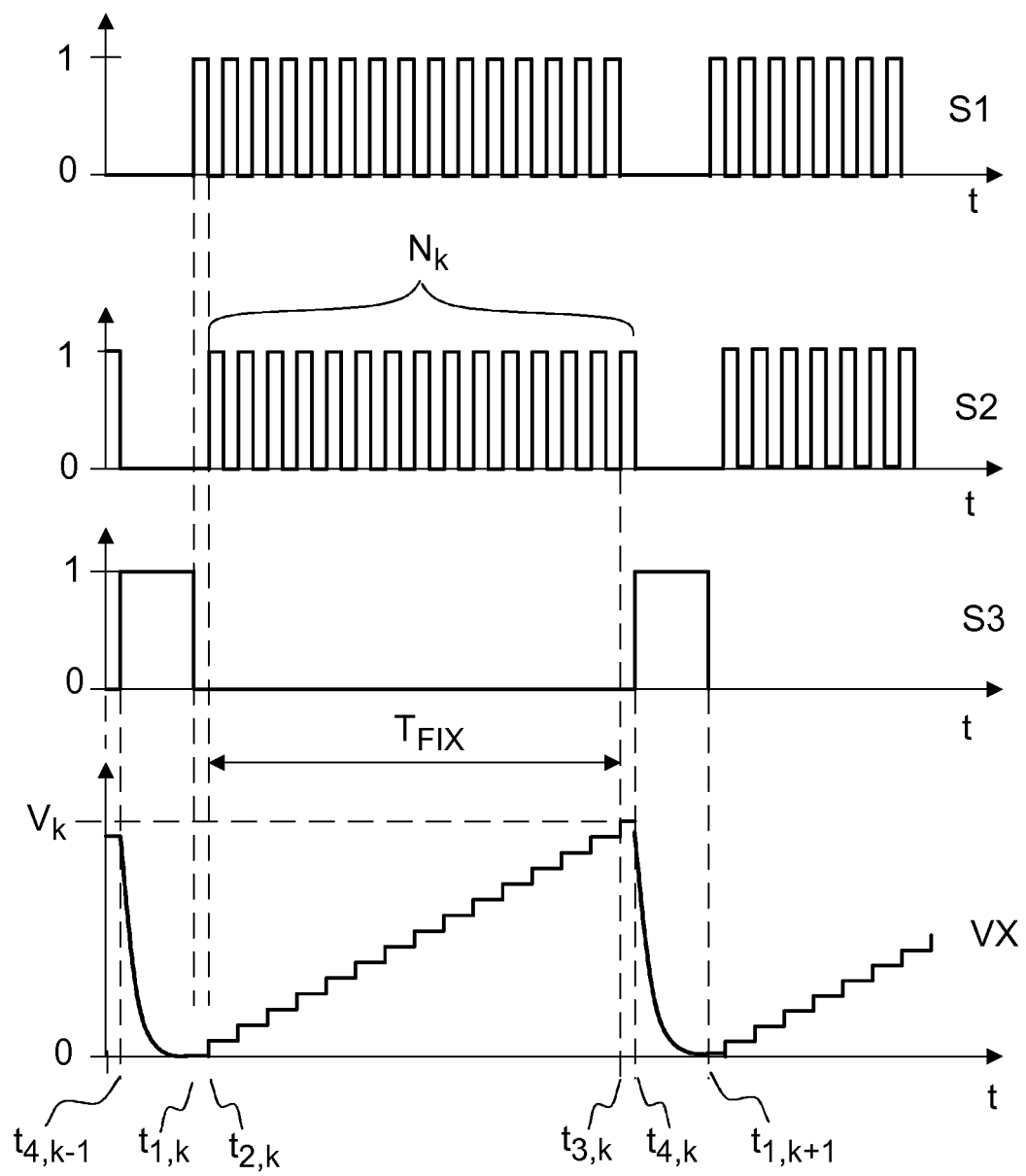
FIG. 9 shows, by way of example, a timing chart for the device of FIG. 8.

The voltage VX of the tank capacitor is increased by closing and opening the switches S1 and S2 consecutively several times e.g. during a predetermined time period $T_{FIX}$ (FIG. 9).

Alternatively, voltage VX of the tank capacitor may be increased by closing and opening the switches S1 and S2 consecutively several times until the voltage VX reaches or exceeds a predetermined voltage level Vref.

The voltage VX may be coupled to an input 71 of the A/D converter 70. The output of the A/D converter 70 may be coupled to an input 61 of the controller 60.

The switches S1, S2, S3 may be controlled by at least one switch driving unit 90, which may be a separate component or incorporated in the controller 60.

The driving unit 90 may be arranged to discharge the tank capacitor C2 by closing the switch S3 after the predetermined time period $T_{FIX}$. Alternatively, the driving unit 90 may be arranged to discharge the tank capacitor C2 by closing the switch S3 when the voltage VX reaches or exceeds a predetermined voltage level Vref.

The controller 60 may be arranged to count the number $N_k$ of charge transfer cycles, i.e. closing times of the switch S2 needed to change the state of the comparator output. The controller 60 may be arranged to send the counted number $N_k$ to an external data processing device 200 via terminals 62, 201.

The counter number $N_k$, or further information dependent on said counted number represents a measurement result.

Alternatively, or in addition, the controller 60 may be arranged to determine the rate of change of the voltage VX during the charging of the tank capacitor C2. The controller 60 may be arranged to determine further information from the rate of change of the voltage VX.

The time period $T_{FIX}$ may be arranged to be short enough so as to provide a substantially linear relationship between the count number $N_k$ and the capacitance value CX.

The reference voltage Vref may be arranged to be low enough so as to provide a substantially linear relationship between the count number and the capacitance value CX. Vref may be e.g. lower than or equal to 30% of the voltage V1 of the voltage supply 40

The data acquisition rate of the A/D converter 70 may be higher than or equal to the switching frequency of the second switch S2 in order to record the voltage value VX for each charge transfer step and in order to capture the maximum number of data points for numerical signal processing. However, the acquisition rate of the A/D converter 70 may also be lower in order to simplify and speed up numerical signal processing.

An analog low pass filter may be coupled before the input 71 of the A/D converter 70 to further reduce noise.

FIG. 9 shows the timing chart for the device of FIG. 8. The first, the second, and the third curves from the top show the states of the switches S1, S2, and S3, respectively. The fourth curve shows temporal evolution of the voltage VX of the tank capacitor C2.

The switch S3 is closed at the time $t_{4,k-1}$ in order to discharge the tank capacitor C2. The switch S3 may be kept closed for a predetermined time in order to ensure that the tank capacitor C2 is discharged to a sufficient degree.

The logical state 0 denotes an open switch and the logical state 1 denotes a closed switch. At least one of the switches S1, S2 should be open during discharging of the tank capacitor C2.

The switch S3 is opened at the time $t_{1,k}$ and the sensor capacitor CX is charged by closing the switch S1. S2 is in the open state. The switch S1 is opened at the time $t_{2,k}$ and the switch S2 is closed in order to transfer charge from the sensor capacitor CX to the tank capacitor C2. The switches S1 and S2 are opened and closed alternately several times until a fixed time period $T_{FIX}$ has been elapsed starting from the time $t_{2,k}$.

At the end of the time period $T_{FIX}$, i.e. at the time $t_{3,k}$, the final value $V_k$ of the voltage VX of the tank capacitor C2 may be recorded. The final value $V_k$ represents the measured value having an index k. The sensor capacitance CX is now approximately inversely proportional to the final value $V_k$.

The switch S3 is closed at the time $t_{4,k}$ in order to discharge the tank capacitor C2 again.

A new charging and charge transfer sequence by using the switches S1 and S2 is started again at the time $t_{1,k+1}$ in order to determine the next final voltage value $V_{k+1}$, i.e. in order to determine a new measurement value.

Instead of the determining the final voltage $V_k$, the controller 60 may also be arranged to determine a change of voltage VX during the charging of the tank capacitor C2. The controller 60 may also be arranged to determine the rate of change of voltage VX, or some other parameter dependent on said rate of change during the charging of the tank capacitor C2.

Figure 10A:
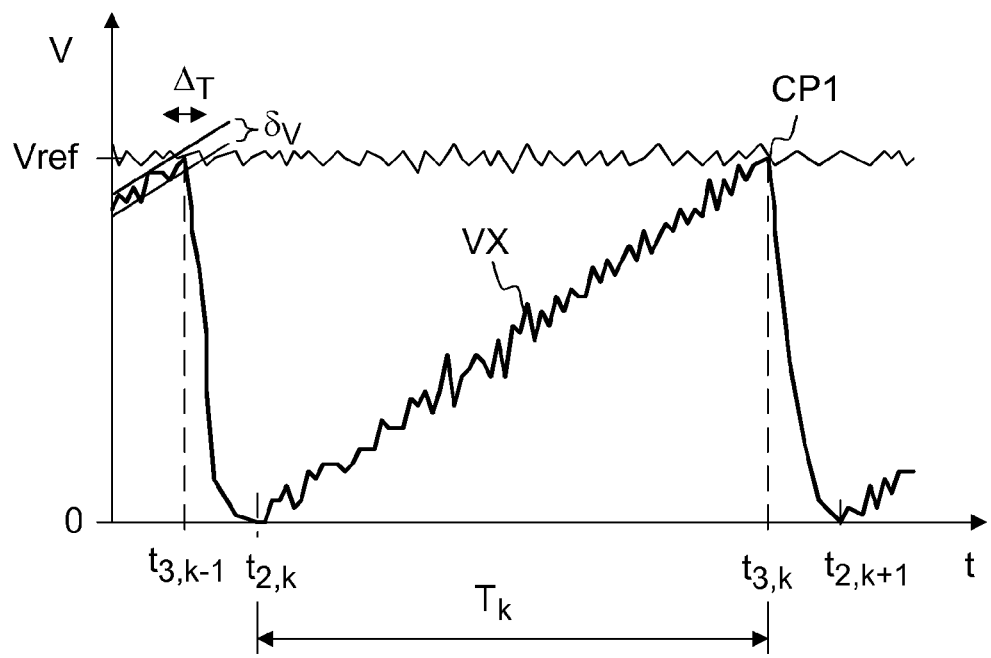
FIG. 10a shows, by way of example, temporal evolution of the capacitor voltage for the device of FIG. 3.

Referring to FIG. 10a, the voltage VX of the tank capacitor may have noise $\delta_V$. Electromagnetic noise may be e.g. originally coupled to the plates 10a, 10b of the sensor 20 and to the wires of the sensor 20. Typically, the most notorious noise components are at 50 Hz (in Europe) and at its harmonics due to the alternating mains voltage of the electrical power network (at 60 Hz in the USA). The noise of the sensor 20, i.e. the noise of the voltage of the sensor capacitor CX is considerably reduced when charge is transferred from the sensor capacitor CX to the tank capacitor, because the combination of the switch S2 and the tank capacitor C2 acts as a low pass filter. However, a part of the noise of the sensor capacitor CX is still carried over to the voltage VX of the tank capacitor C2. Noise may also be coupled directly to the measuring circuit of the device 100. Also the reference voltage level Vref at the input of the comparator may have considerable noise, as well.

The length of the time period $T_k$ and/or the count number $N_k$ is determined by detecting the time when the voltage VX reaches or exceeds the reference voltage level Vref. In other words, the length of the time period $T_k$ and/or the count number $N_k$ may be measured by determining the point CP1 where the voltage curve of VX touches or intersects the reference voltage level Vref.

The noise causes uncertainty in the determination of the voltage VX of the tank capacitor C2, and consequently a variation $\Delta_T$ in the length of the determined time period $T_k$, and/or a variation in the value of the count number $N_k$.

The effect of the noise may be reduced if several voltage values are taken into consideration instead of a single voltage value provided by the A/D converter 70.

Figure 10B:
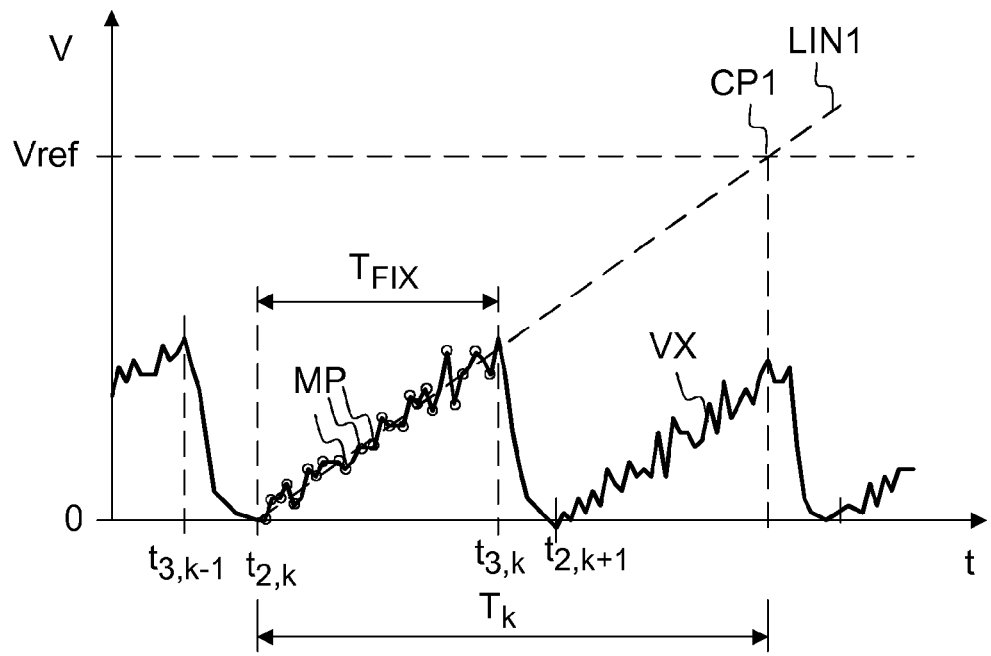
FIG. 10b shows, by way of example, temporal evolution of the capacitor voltage for the device of FIG. 8

Referring to FIG. 10b, a line LIN1, which passes through zero voltage at $t_{2,k}$, may be fitted to two or more further voltage values MP. Thus, the location of the intersection point CP1 may be interpolated or extrapolated. CP1 is the intersection point of the line LIN1 and the reference voltage level Vref. The line LIN1 may be fitted to substantially all voltage values MP measured during a time period $T_{FIX}$ in order to improve measurement accuracy. For example, least squares fitting may be used to determiner the slope of the line LIN1. The slope of the line LIN1 approximates the time derivative of the voltage VX of the tank capacitor C2, i.e. the rate of change.

The length of the time period $T_{FIX}$ may be fixed and it may be substantially shorter than a time period $T_k$ which would be needed for actually reaching a reference voltage level Vref. Thus, one may determine the intersection point CP1, the time period $T_k$, and the count number $N_k$ by extrapolation. Consequently, the capacitance CX of the sensor 20 may be determined at a higher rate than without extrapolation.

The controller 60 may also be arranged to perform signal processing operations needed for fitting and extrapolation.

The relationship between the voltage VX and time is not exactly linear. Also an exponential curve may be fitted to the measurement points MP instead of the line LIN1.

Instead of fitting and extrapolation, the controller 60 may also be arranged to determine when an average $V_{AVE}$ of at least two voltage values MP of the tank capacitor voltage VX exceeds a predetermined reference voltage Vref. The reference voltage level Vref may also be adaptively adjusted in order to ensure sufficient resolution and/or sufficient sampling rate. Said adjustment may be made by the controller 60 or the computer 200 based on a measured value provided by a previous measurement cycle.

The controller 60 may also be arranged to determine a rate of change of the tank voltage VX on the basis of a difference between a first average value of a first group of points MP and a second average value of a second group of points MP.

Figure 11:
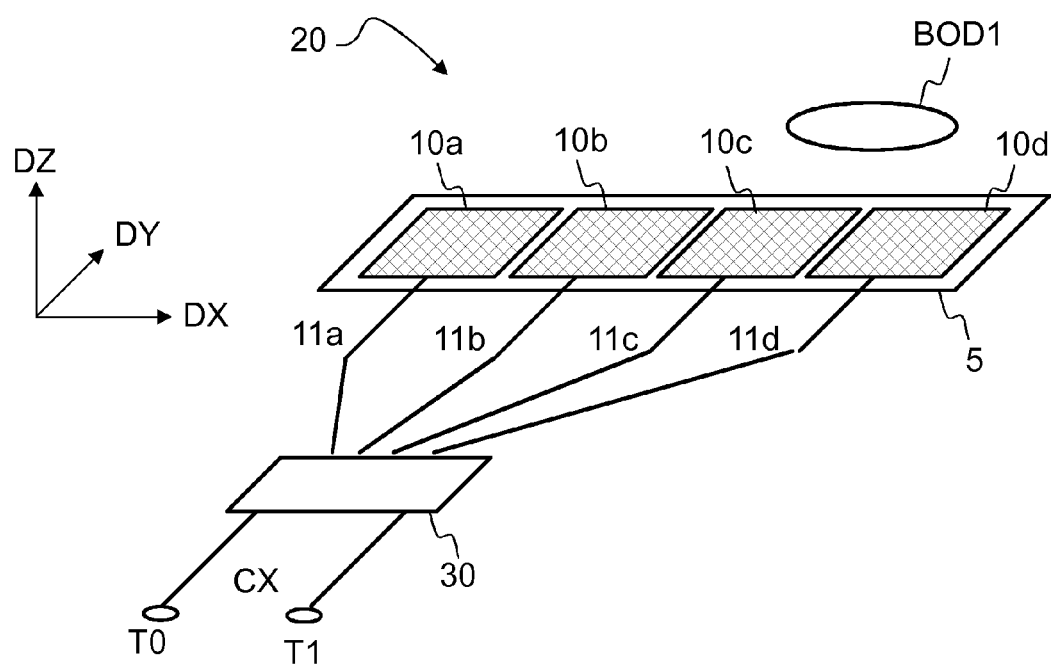
FIG. 11 shows, in a three-dimensional view, a capacitive sensor array.

Referring to FIG. 11, a sensor array 20 may comprise an array of plates 10a, 10b, 10c, and 10d in order to detect the location of the object BOD1. Each plate 10a, 10b, 10c, 10d may be connected to a multiplexer 30 by conductors 11a, 11b, 11c, 11d. The multiplexer 30 may be arranged to couple each plate 10a, 10b, 10c, 10d sequentially to the terminal T1. One or more of the adjacent plates may be sequentially coupled to the other terminal T0, respectively. For example, when the plate 10c is coupled to the terminal T1, the adjacent plate 11b may be coupled to the terminal T1 to establish a capacitive sensor CX formed by the plates 10b and 10c.

The terminals T0 and T1 of the multiplexer 30 may be coupled to the measuring circuit as shown in FIGS. 3 and 8.

The multiplexer 30 may be further arranged to communicate with the controller 60 and/or with the data processor 200 in order to associate the measured signal with the location of the currently activated sensor plates, i.e. to indicate the location of the object BOD1.

FIG. 12a illustrates a sensor web W for monitoring electrically conductive objects, for example the movement and location of a human body. It is possible, for example, to use the web W for monitoring aged and disabled people. Also possible applications include but are not limited to the monitoring of jails and prisons, home and industrial automation, vehicle airbag systems and other sensing applications. The sensor web W comprises sequential electrically conductive areas 1. A conductor 2 connects the electrically conductive area 1 to an output 3. The output 3 is provided with a connector. The parallel conductors 2 extend linearly and form an angle α to the longitudinal direction LD of the web W.

A piece of said web W may be used as a floor sensor.

A sensor array 20 may be a piece cut from a longitudinal web W. The web W may comprise a plurality of plates 1, each having a conductor 2. The conductor 2 of several plates 1 may be arranged to extend to a connection area 3 at a cut end of the web W. Thus, it is easy attach the measuring circuit or extension cables to the sensor 20, e.g. by using crimp connectors.

The plates and the conductors of an uncut web W may be periodically arranged on the substrate 5 such that a sensor array 20 may be formed by cutting from the web W. In case of FIG. 12a, the sensor array 20 may comprise five or less plates 1, wherein the conductors 2 of said plates extend to the connection area 3 at the end of the sensor 20.

FIG. 12b shows a cross-sectional view of the sensor web W (section A-A in FIG. 12a). The sensor product comprises a substrate 5, electrically conductive areas 1 which form sensor elements formed on the surface of the substrate 5 and conductors 2 connecting the sensor elements to an output 3. The electrically conductive areas 1 may, for example, consist of etched copper.

The plates 1 and the conductors 2 are arranged on an electrically insulating substrate 5. The plates 1 and the conductors 2 may be covered with a protective layer 4 in order to prevent wear and electric contact with the object BOD1.

The sensor 20 may also be implemented without the protective layer 4. The sensor 20 may also be implemented upside down. The conductors 2 and the plates 1 may be on different sides of the substrate 5. The sensor 20 may comprise further protective and/or electrically insulating layers.

Electrically conductive areas and conductors may be die-cut from a metal foil, and they may be laminated between two substrates, i.e. between two superimposed webs.

Electrically conductive areas and their conductors may be located in one layer, and optional RF loops and their conductors may be located in another layer. In principle, it is possible to use different techniques, e.g. etching, printing, or die-cutting, in the same product. For example, the electrically conductive areas may be die-cut from a metal foil, but their conductors may be etched. The electrically conductive areas and their conductors may be connected to each other through vias.

The device 100 according to the invention may be used e.g. to monitor the presence and/or movements of people in private houses, banks or factories in order to implement an anti-theft alarm system. A network of sensors 20 may be used to monitor the presence and/or movements of people in department stores e.g. in order to optimize layout of the shelves. The sensor may be used e.g. in hospitals or old people's homes to detect patient activity and their vital functions. The sensor may be used in prisons to monitor forbidden areas. The sensor may be used for detecting movement of other large conductive bodies, such as wheelchairs or aluminum ladders. The sensor may be used for detecting movement of animals.

The sensor 20 may be installed e.g. in or on a floor structure. The measuring circuit may be close to the sensor 20 so as to reduce noise. The distance between the first plate 10a of the sensor 20 and the tank capacitor C2 may be e.g. smaller than or equal to 0.5 m. The width of the first plate 10a may be e.g. greater than equal to 10 times the width of a conductor 2 which connects the first plate 10a to the measuring circuit. The whole proximity detecting device 100 may be installed e.g. on or in a floor structure so as to minimize the distance between the sensor 20 and the tank capacitor C2. For example, the distance between the tank capacitor C2 and the upper surface of the floor may be smaller than or equal to 50 mm.

The distance from both plates 10a, 10b of a capacitive sensor C2 to the tank capacitor C2 may be smaller than or equal to 0.5 m in order to reduce noise.

Figure 13:
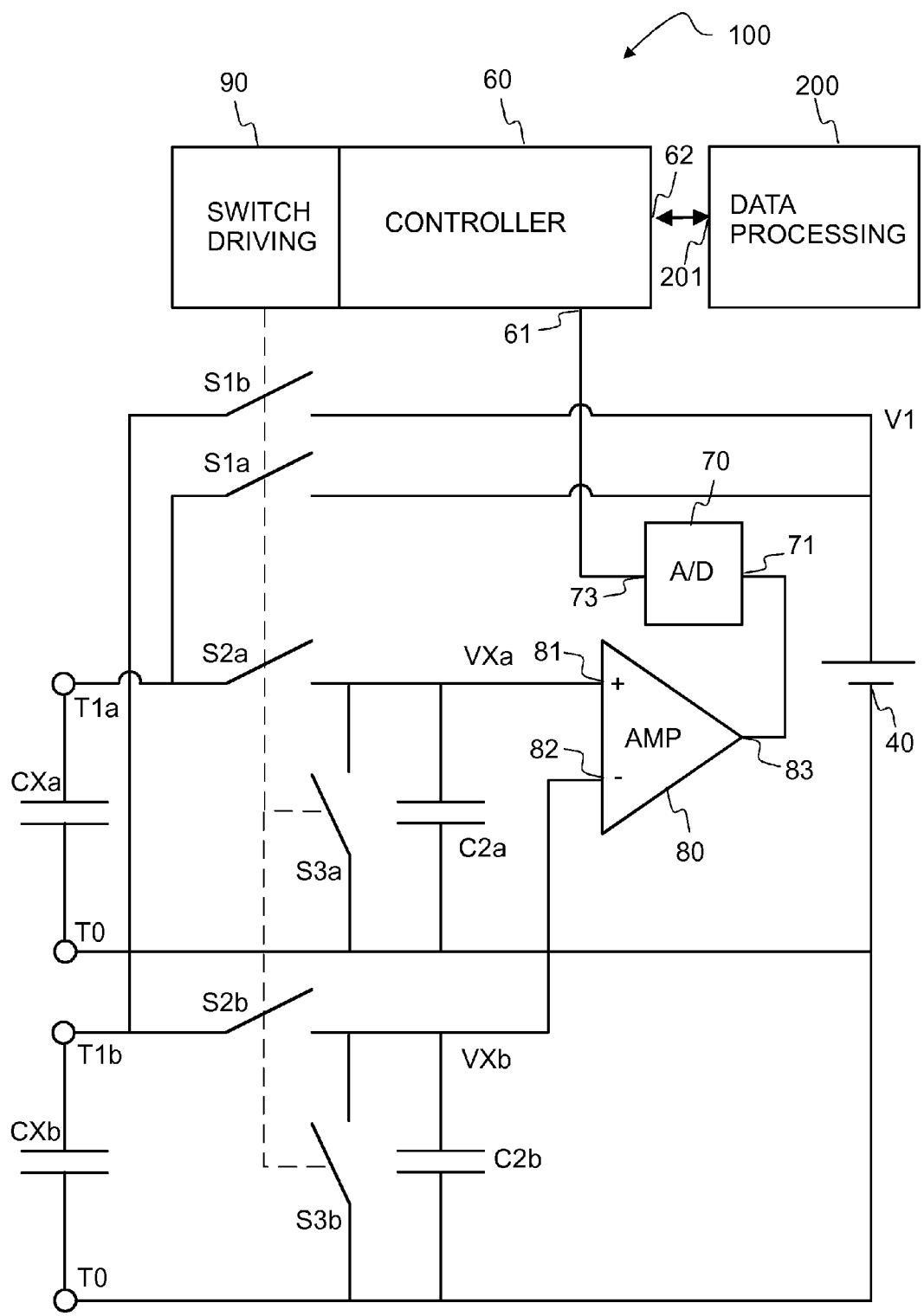
FIG. 13 shows the circuit diagram of a differential capacitance measuring device.

Referring to FIG. 13, two capacitive sensors may be coupled to a differential measuring circuit in order to reduce the effect of noise. In certain cases it is probable that electromagnetic noise is coupled to adjacent capacitive sensors in a substantially similar way. Thus, the induced common-mode noise may be effectively eliminated by a differential measurement, wherein the movement of an object BOD1 in the vicinity of the sensors may cause a difference in the capacitances of the two sensors.

A proximity detecting device 100 may comprise a first capacitive sensor represented by a first sensor capacitance CXa, and a second capacitive sensor represented by a second sensor capacitance CXb. The device 100 may comprise a first sub-unit for determining the first sensor capacitance CXa, said first sub-unit comprising switches S1a, S2a, S3a, and a first tank capacitor C2a. The device 100 may comprise a second sub-unit for determining the second sensor capacitance CXb, said second sub-unit comprising switches S1b, S2b, S3b, and a second tank capacitor C2b. In addition, the device 100 may comprise a voltage supply 40, differential amplifier 80, A/D converter 70, and controller 60.

First, the switches S3a, S3b may be arranged to discharge the tank capacitors C2a, C2b. Then, the first tank capacitor C2a may be charged via the switches S1a, S2a, and via the first sensor capacitor CXa as described in the context of FIG. 8. The second tank capacitor C2b may be substantially simultaneously charged via the switches S1a, S2a, and via the second sensor capacitor CX2 as described in the context of FIG. 8. Consequently, the voltage VXa of the first tank capacitor C2a increases, and also the voltage VXb of the second tank capacitor C2b increases. Assuming that the object BOD1 is closer to the first sensor represented by the sensor capacitance CXa than to the second sensor represented by the sensor capacitance CXb, first sensor transfers charge to the first tank capacitor C2a more effectively than what is the case for the second sensor. Thus, the voltage VXa of the first tank capacitor C2a increases at a higher rate than the voltage VXb of the second tank capacitor C2b. The first tank capacitor CXa may be coupled to a non-inverting input 81 of the differential amplifier 80. The second tank capacitor CXb may be coupled to a non-inverting input 82 of the differential amplifier 80. Thus, the differential amplifier 80 may be arranged to amplify the difference VXa-VXb between the voltages VXa, and VXb. The output 83 of the amplifier 80 may be coupled to an input 71 of an A/D converter 70. The output 73 of the A/D converter may be coupled to an input 61 of the controller 60.

The first node of the voltage source 40 is coupled to the first terminal T0 of the sensor capacitor CXa. The second node of the voltage source 40 is coupled to the terminal T1a of the first sensor capacitor CXa by the switch S1a. Thus, the sensor capacitor CXa may be charged to substantially the voltage V1 of the supply 40.

The first node of the voltage source 40 is coupled to the first terminal T0 of the sensor capacitor CXb. The second node of the voltage source 40 is coupled to the terminal T1b of the second sensor capacitor CXb by the switch S1b. Thus, the sensor capacitor CXb may be charged to substantially the voltage V1 of the supply 40.

The terminal T0 may also be connected to the ground GND. However, this is not always necessary.

The switch drive unit 90 may be arranged to control the switches as in case of FIG. 8. The controller 60 may communicate with a data processor 200 via terminals 62, 201. The voltage supply 40 provides the voltage V1.

The tank capacitors C2a, C2b may be discharged by closing the switches S3a, S3b. Then, the switches S3a, S3b are opened and kept in the open state. The sensor capacitor CXa is charged by closing the switch S1a, while the switch S2a is in the open state. The sensor capacitor CXb is charged by closing the switch S1b, while the switch S2b is in the open state. Then the switches S1a, S1b are opened and charges are transferred from the sensor capacitors CXa, Cxb to the tank capacitors C2a, C2b by closing the switches S2a, S2b. The transferred charges increase the voltages VXa, VXb over the tank capacitors.

The voltages VXa, VXb of the tank capacitors are increased by closing and opening the switches S1a, S1b, S2a, S2b consecutively several times.

The voltage VXa may rise at a rate $\Delta V_a/dt$. The voltage VXb may rise at a rate $\Delta V_b/dt$. The voltages VXa, VXb increase at different rates because the object BOD1 may be e.g. closer to the first sensor than the second sensor. The difference $\Delta V_a/dt - \Delta V_b/dt$ between the rising rates represents a measurement value, which can be determined and/or calculated from the output of the A/D converter 70.

A positive difference may indicate that an object BOD1 is closer to the first sensor CXa, and a negative difference may indicate that the object is closer to the second sensor CXb.

The differential amplifier 80 may be omitted if two A/D converters are used substantially simultaneously (not shown in FIG. 13).

Figure 14A:
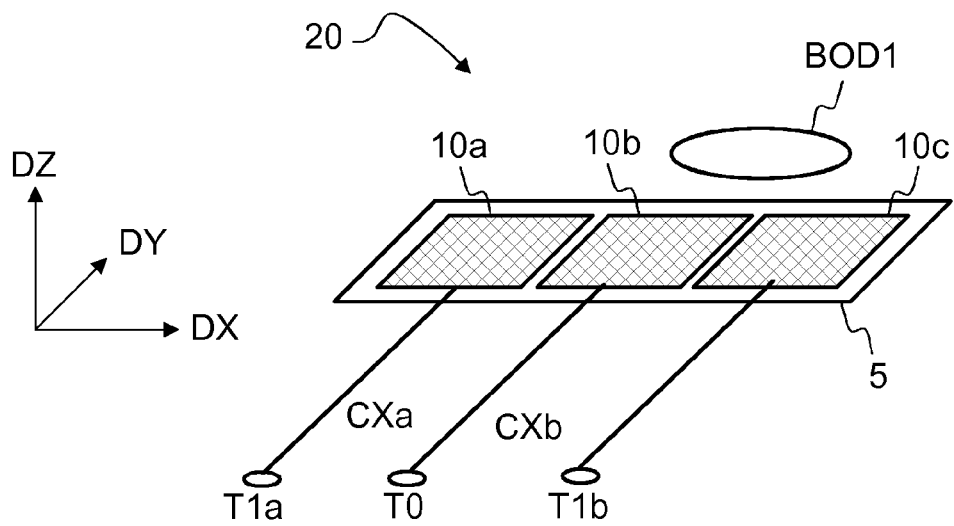
FIG. 14a shows, in a three-dimensional view, a capacitive proximity sensor comprising three plates.
Figure 14B:
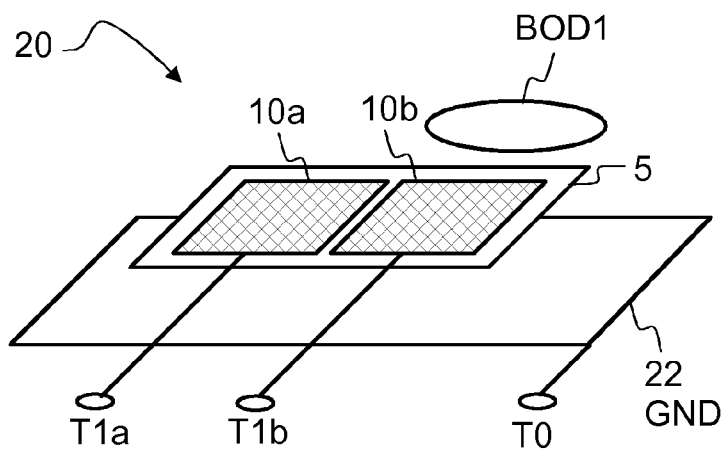
FIG. 14b shows, in a three-dimensional view, a capacitive proximity sensor comprising two plates, said sensor being disposed over an electric ground.

FIGS. 14a and 14b show sensor arrays 20 suitable for use with the device 100 of FIG. 13. Referring to FIG. 14a, the sensor array 20 may comprise a first plate 10a, a second plate 10b, and a third plate 10c disposed on a substrate 5. The first plate 10a is connected to the terminal T1a, the second plate may be connected to the terminal T0, and the third plate may be connected to terminal T1b.

The first plate 10a and the second plate 10b may together form a first capacitive proximity sensor represented by a sensor capacitance CXa. The second plate 10b and the third plate 10c may together form a second capacitive proximity sensor represented by a sensor capacitance CXb.

The terminals T1a, T1b and T0 may be coupled to the device 100 as shown in FIG. 13. The capacitance CXa is higher than the capacitance CXb when the object BOD1 is closer to the plate 10a than to the plate 10c (assuming that the dielectric constant of the object BOD1 is greater than one).

Referring to FIG. 14b, the sensor array 20 may comprise a first plate 10a, and a second plate 10b disposed on a substrate 5. The first plate 10a may be connected to the terminal T1a, and the second plate 10b may be connected to the terminal T1b. The sensor array 20 may operated in combination with a conductive structure 22. The conductive structure 22 may be e.g. earth, a large metal plate or water pipeline system of a building. Thus the conductive structure 22 may be an electrical ground GND. The terminal T0 may be coupled to the conductive structure 22, which in this case acts as capacitive element of a capacitive sensor.

Now, a first capacitive sensor is formed between the first plate 10a and the conductive structure 22. A second capacitive structure is formed between the second plate 10b and the conductive structure 22.

The terminals T1a, T1b and T0 may be coupled to the device 100 as shown in FIG. 13. The capacitance CXa is higher than the capacitance CXb when the object BOD1 is closer to the plate 10a than to the plate 10b (assuming that the dielectric constant of the object BOD1 is greater than one).

The attainable resolution depends on the number of consecutive charge transfer cycles needed to charge the tank capacitor C2 before resetting (i.e. discharging). For example, a count number $N_k$ or time period $T_k$ determined on the basis of 1024 charge transfer cycles corresponds to a resolution of 10 bits. For example, a count number $N_k$ or time period $T_k$ determined on the basis of 256 charge transfer cycles correspond to a resolution of 8 bits Referring back to FIGS. 3 and 8, the switches S1 and S2 may also be bidirectional, and the voltage of the voltage supply 40 may also be changed. The voltage V1 of the voltage supply may be changed to zero or its polarity may even be reversed. Consequently, the tank capacitor may also be discharged via the switches S1 and S2 and the sensor capacitor CX back to the voltage supply. In that case it is not necessary to operate the discharging switch S3, and it might even be eliminated from the system. The count value $N_k$ may be recorded both during charging and discharging of the tank capacitor C2. Thus, the sampling rate can be increased even further.

The device 100 may comprise one or more low-pass filters to reduce noise. For example, an analog low-pass filter may be implemented between the amplifier 80 and the A/D converter 70 in FIG. 13.

In many cases, it is not necessary to determine the absolute value of the capacitance CX. It may be sufficient to detect changes in the value of said capacitance CX.

Respiratory and cardiac functions cause periodic variations in the spatial distribution of blood in human beings and animals, i.e. in the object BOD1. These cause periodic variations in the capacitance of the sensor 20. Thus, the device 100 may be used for monitoring cardiac and/or respiratory function of human beings or animals. A person may be lying on a sensor or sensor disposed on a floor or a bed. An additional carpet or mattress may be positioned over the sensor 20, i.e. between the sensor and the person.

The measurement of the capacitance is important in capacitive sensors. The value of the capacitance is proportional to the measured signal value, and may vary as a function of time. The accuracy and speed of the capacitance measurement directly defines the properties of the capacitive sensor or other application where the measurement of the capacitance is important. In some cases, the capacitance to be measured is very small, and the measurement is made by integrating a very low-energy signal. The measurement is therefore sensitive to the interference of electromagnetic radiation. The low energy means that either the integration period or the signal value is very small, which makes it difficult to sample and quantize the capacitance values to a digital signal with a sufficiently high resolution. Sampling and quantization would be needed to process the signal further e.g. with a computer or a microcontroller.

Measuring the capacitance by using the switched capacitor method makes it possible to integrate the low energy signal into a larger energy signal before sampling and quantization. Therefore the measurement is not so sensitive to interferences any longer. It is also possible to control the measurement to optimize the resolution. The measurement method according to the invention also introduces an analog low-pass filter into the measurement circuit, further attenuating high frequency interference signals.

The method and the device according to the invention may be implemented by adding a known capacitor and processor-controlled switches to the measuring circuit.

In the concept of switched capacitor circuits, a capacitor is connected between two switches S1, S2. The switches S1 and S2 are opened and closed in turns. The switches are preferably never closed at the same time. In this kind of circuit, the capacitor will act like a resistance, whose value is $$R_C = \frac{1}{f_{sw}C} \quad (1)$$

where $f_{sw}$ is the switching frequency of the switches and C is the capacitance. $R_c$ defines the relationship between a voltage over the capacitor C and the current transferred by the capacitor C.

Switched capacitors may be used e.g. in analog signal processing, since the resistance $R_c$ can be adjusted by changing the switching frequency $f_{SW}$.

Referring back to FIG. 2, a switched capacitor circuit may comprise the sensor capacitance CX and two switches S1 and S2. When the switched capacitor circuit is operating, a known switching frequency $f_{sw}$ may be used to open and close the first switch S1 and the second switch S2 in such a way that when the first switch S1 is closed the second switch S2 is open and vice versa. A known capacitor C2 is charged through the switched capacitor circuit by closing the first switch S1 to charge the sensor capacitance CX. After a certain time period defined by the switching frequency $f_{sw}$, the first switch S1 is opened and the second switch S2 is closed to charge the known capacitor $C_2$ by moving charge from the sensor capacitor CX to the known capacitor C2. The time constant of the formed RC-circuit may be then measured, and it is proportional to the capacitance value of CX.

The measured time constant may depend on three factors: the switching frequency $f_{sw}$, the capacitance of C2, and the loading voltage V (i.e. the voltage level of the capacitor C2 attained after charge transfer). Therefore, the measurement time and accuracy can be adjusted to maximize resolution and to minimize the measurement time. The adjustment can also be accomplished by software, making it also possible to extend the measurement range, time or accuracy during the measurement. Furthermore, the first-order low-pass filter, formed by the RC-circuit, attenuates the high frequency electro-magnetic disturbances considerably.

The proposed method may utilize two switches and the known capacitance in addition to components used for a direct time constant measurement of CX. Therefore, in many cases, the circuit is not too complicated or expensive.

The purpose may be to measure the capacitance of the capacitive sensor as accurately as possible (at an accuracy of more than 8 bits) at minimum costs. The system may be capable of measuring capacitance variations of a frequency of 0 to 40 Hz.

The magnitude of noise signals induced to the system (50 Hz and multiples, as well as sampling jitter) is likely to be multiple in comparison to the signal being measured.

A micro controller, whose properties are listed in table 1, may be used in the experiments. Possible measuring parameters are listed in table 2.

TABLE 1

| Properties of AtMega8L (trade mark) micro controller | |
|---|---|
| Clock frequency | 8 MHz |
| Program memory | 8 kB Flash |
| Data memory | 1 kB SRAM |
| Non-volatile data memory | 512 B EEPROM |
| Timers | 2 × 8 b, 1 × 16 b |
| ADC | 1 × 10 b |
| Analogue comparator | 1 |
| Digital I/O | 23 |
| Operating voltage | 2.7 V-5.5 V |

Flash means flash memory, SRAM means static random access memory, EEPROM means electrically erasable programmable read-only memory, ADC means A/D converter, I/O means input/output, and b means bit.

TABLE 2

| Measuring parameters | |
|---|---|
| Operating voltage | $V_{cc}$ = 5 V |
| Target voltage | $V_t \approx V_{cc}/3$ = 1.7 V |
| Sensor capacitor | 200-400 pF |
| Resistance | 0.1 mΩ |

The switched capacitor measurement circuit was shown in FIG. 2. During switching the switches $S_1$ and $S_2$ are opened and closed alternately, both on frequency $f_{sw}$, and the capacitor $C_1$ operates like a resistance in the switching. Thus, the capacitor C2 is charged little by little. The flow resistance $R_c$ caused by CX depends on both the capacitance CX and the switching frequency $f_{sw}$ according to the following formula $$R_C = \frac{1}{f_{SW} CX} \quad (2)$$

It is possible to determine the capacitance CX when C2 and $f_{sw}$ are known. Since the capacitance of the known capacitor C2 and the switching frequency $f_{sw}$ can be selected relatively freely, the charging time of the known capacitor C2 can be selected as suitable.

The charging time $t_{CHARGE}$ may be calculated from the equation $$t_{CHARGE} = -\ln\frac{2}{3} \frac{C2}{f_{SW} CX} \quad (3)$$

When the charging time is known, and when it is known that a value x of a counter received from the measuring device is a product of the charging time $t_{CHARGE}$ and the clock frequency of the processor $F_{clk}$:

$$x = t \cdot F_{CLK}, \quad (4)$$

the capacitance CX of the sensor may be calculated from the value x of the counter:

$$CX = -\ln\frac{2}{3} \frac{F_{CLK}}{f_{SW}} \frac{C2}{x}. \quad (5)$$

The resolution $r_t$ attainable with a switched capacitor switching can be calculated from the formula:

$$r_t = 20 \cdot \log_{10}\left(-\ln\left(\frac{2}{3}\right)\frac{F_{CLK}}{f_{SW}} \frac{C2}{CX}\right) \quad (6)$$

where $F_{clk}$ is the clock frequency of the processor (the frequency by which the value x of the counter is increased). The switching frequency $f_{sw}$ may be produced with, for example, by the PWM (pulse width modulation) generator of the processor, in which case it will not use CPU (central processing unit) time of the processor. The frequency of performing the measurement (i.e. examining the status of an I/O port) depends on how much processing resources the processor requires for signal processing operations.

FIG. 7a shows the capacitance C2 as a function of the sampling frequency. The sampling frequency is indicated on the horizontal axis (abscissa). FIG. 7a shows what the ratio of the freely selectable parameters may be when 12-bit resolution is desired for the measuring accuracy.

One possible arrangement is that the switching frequency $F_{sw}$=500 kHz, clock frequency $F_{clk}$=8 MHz and C2=470 nF. With these parameters it is possible to reach a sampling frequency slightly higher than 100 Hz.

In the analysis of measuring accuracy, the focus is mainly on what accuracy can be reached with the micro processor used. Analog components and switches may also have an effect on the measuring accuracy.

In the switched capacitor switching, at least the low pass filter formed by the switched capacitor (CX) and the known capacitor C2 filter out high frequencies, in which case the signal should not fold a great deal. The cutoff frequency of the filter may be derived from the formula:

$$f_C = \frac{1}{2\pi RC} = \frac{1}{2\pi} \frac{CX}{C2} f_{SW}$$

The dependence of the cutoff frequency from the selected capacitance is shown in FIG. 7b. The vertical axis shows the cutoff frequency. With the above-listed component values ($F_{sw}$=500 kHz, $F_{clk}$=8 MHz, and C2=470 nF), the cutoff frequency is approximately $f_c$=100 Hz. The cutoff frequency cannot be selected freely, because the same parameters also have an effect on the selection of desired measuring accuracy. In addition, the filter thus formed is only of a first degree, and its steepness is only around −6 dB per octave.

A further analog low pass filter may also be connected to the circuit so that harmful folding of the signal can be avoided.

Due to the analog filtering, it would be likely that the sampled signal includes frequencies in a less interesting frequency band. Impulse-like noise might thus be filtered out relatively well already before the sampling. The same sampling jitter problem due to the variation of sampling time as in a direct measurement of charging time might still occur.

In the switched capacitor switching, an analog switching device is required on both sides of the capacitor. For that purpose, e.g. analog switches or FET transistors can be used. In view of operation of the switching, it is important that their resistance when the switch is closed, as well as the capacitance of the switch, is as low as possible. The resistance may be reduced by increasing the area of the semiconductor channel. Increasing the area, however, increases the capacitance of the switch. Therefore, when seeking a small capacitance, it may be needed to select a slightly larger resistance. Analogue switching devices possibly suitable for switching, as well as their key parameters, are listed in table 3.

TABLE 3

Resistances and capacitances of analog switching devices

| Component | Code | $R_{on}$ | Capacitance |
|---|---|---|---|
| Analog switch | MAX312CPE | 6.5 Ω | 47 pF |
| Analog switch | CD4066BE | 470 Ω | 8 pF |
| Analog switch | DG403DJ | 50 Ω | 39 pF |
| Power MOSFET | SFP9530 | <0.3 Ω | 160 pF |
| N-channel MOSFET | 2N5457 | >1 kΩ | 3 pF |

MAX312CPE, CD4066BE DG403DJ, SFP9530, and 2N5457 are identification codes used by one or more component manufacturers. $R_{ON}$ means the resistance in the conducting state.

The resistance of the switching device is not a very critical factor, because the charged capacitance is typically only around 200 to 400 pF. If the resistance of the switch does not rise much above a kilo-ohm, the charging time of the capacitor when charging through the switch still remains so small that a switching frequency of even 1 MHz can be used. Frequencies higher than 1 MHz might cause radio interferences On the other hand, the capacitance of the switching device may well approach 50% of the capacitance of the sensor capacitor. Thus, the capacitance of the switching device has a great effect on the measuring result. Because of this, it is advantageous to select such a switching device, whose capacitance is as low as possible, even if its resistance would then be higher.

A switching circuit where the analogue switch DG403DJ is used is shown in FIG. 5. DG403DJ includes an internal inverter, in which case one switch is always open and another one closed. The other switches require an external inverter circuit, with which the inverted control can be input separately for one of the switches.

The operation of the measuring circuit may be analyzed e.g. by using a computer together with a computer program. With this program, it may be possible to print measured values onto the screen in real time. The values may be received by a computer such as a PC from the micro controller via a serial line. An example output (counter value) of the measurement is shown in FIG. 6. The sampling frequency was 19.52 Hz. The smallest sample number was 9670 and the largest 33991.

In the switched measuring method, the charge of a small sensor capacitor may be transferred to a larger capacitor thousands of times before its voltage rises to a level corresponding to the voltage of a logical one. Therefore, the charging time can be measured at a high resolution even with a low clock frequency. In addition, the measuring circuit forms a low pass filter, which attenuates high frequency interferences. In a direct measuring method, the interference would be folded onto the sampled signal. Both the size of the loaded capacitor and the switching frequency of the sensor capacitor have an effect on the charging time. The switching frequency and therefore also the charging time can be controlled by a computer program. The switched-capacitor measuring method may significantly improve the level of the measuring signal when compared to direct measurement of charging time. The noise level of the signal may decrease significantly, and the resolution of the measurement may increase e.g. to approximately 14 or 15 bits.

However, the switched-capacitor measuring mode has some drawbacks as well. When the charging time of the tank capacitor increases, also the highest attainable sampling frequency (data acquisition rate) decreases. The theoretical maximum sampling frequency is between 250 and 500 Hz, when using an 8 MHz processor and 14 to 15-bit measuring accuracy. In practice, the maximum sampling frequency may be e.g. 160 Hz. The switched-capacitor measuring method also requires a circuit which is only a little more complicated and expensive than in the direct measuring method.

By adjusting the capacitance of the tank capacitor and the switching frequency, it is possible to change the measuring resolution, the duration of the measurement and the cutoff frequency of the low pass filter of the circuit. Unfortunately, the resolution, duration and cutoff frequency cannot be set independently of each other. In practice, it is possible to set the two most important ones: resolution and duration. The cutoff frequency may remain high in practice, in which case the noise signal might fold over the effective signal during sampling.

The invention can be utilized in a capacitive floor sensor. The capacitance of the floor sensor is low which makes it difficult to measure the capacitance accurately by using a cost-effective microcontroller embedded in a floor sensor element. The proposed method increases the measurement accuracy to about 12-14 bits when compared to 7-bits of a direct time constant measurement. Utilizing this invention, it may be possible to use an inexpensive, low-power microcontroller in the measurement unit.

The cost and power consumption of the micro-controller can be important, because it may be powered from a battery and embedded in a floor sensor element.

The switched capacitor circuit has a large measurement range. The floor sensors need to be capable of measuring both small capacitances, to detect someone stepping on the element, and double or triple capacitances, when someone is lying on the sensor. In both cases, the sensor should advantageously be capable of measuring capacitance changes which are likely to be only 1:1000 of the maximum value.

The measurement range of a switched capacitor circuit may be adjusted. When a person is walking over a floor sensor, the capacitance of the sensor is e.g. only about 200 pF. However, when somebody is lying on the sensor, its capacitance may increase e.g. to 400-500 pF. In this case, it may be necessary to rapidly change the measurement range, in order to get improved measurement accuracy. This is possible e.g. by changing the switching frequency or by changing the loading capacitance by software.

The measurement time may be adjusted. In some cases, there may be persons walking fast across a floor. In this case, the elements of the floor may be rapidly scanned using low accuracy, so as to monitor the fast movement. When a person is lying on the floor, a higher accuracy may be required in order to monitor the breathing and the heartbeat of the person. The measurement time can now be longer. The measurement mode of the system can be adjusted to a slower but more accurate state by choosing a higher tank capacitance or by lowering the switching frequency.

The switched capacitor circuit may be calibrated automatically. When the floor sensors are installed in various environments, their bare-capacitance can be different from place to place. To measure effectively in all kind of environments, the sensor needs to adjust the measurement range suitable and to calibrate the measured values using the bare-capacitance. The calibration is easier and more effective when the measurement range can be changed by the software.

A time constant may be interpreted to be a time it takes the system's step response to reach 63.2% of its final (asymptotic) value, i.e. 36.8% below its final value. When the capacitance is connected to a voltage source through a series resistor, a time constant may be a time it takes until the voltage over the capacitance has reached 63.2% of the voltage of the voltage source.

Sampling means conversion of an analog signal to a digital signal.

Sampling method means a manner in which the analogue variable, e.g. the charging time of the capacitor, is converted to a digital variable.

Measuring algorithm means the signal processing operations performed on the sampled signal in order to separate the signal being searched from noise and other interferences.

The word "comprising" is to be interpreted in the open-ended meaning, i.e. a sensor which comprises a first electrode and a second electrode may also comprise further electrodes and/or further parts.

For a person skilled in the art, it will be clear that modifications and variations of the devices and the method according to the present invention are perceivable. The particular embodiments and examples described above with reference to the accompanying drawings are illustrative only and not meant to limit the scope of the invention, which is defined by the appended claims.

The invention claimed is:

1. A device for capacitively detecting an object, said device comprising:
a capacitive sensor having a sensor capacitor formed between at least one first capacitive element and at least one second capacitive element such that a presence of said object can change a capacitance of said sensor capacitor,
a voltage supply,
a first switch to couple said sensor capacitor to said voltage supply in order to charge said sensor capacitor,
a tank capacitor having an adjustable capacitance,
a second switch to couple said sensor capacitor to said tank capacitor in order to transfer charge from said sensor capacitor to said tank capacitor and to change the voltage of said tank capacitor,
at least one switch driver unit to control said charging and charge transfer by opening and closing said switches several times such that said switches are not in the closed state simultaneously,
a voltage monitoring unit to monitor the voltage of said tank capacitor, and
a controller to determine at least one measurement value which depends on the rate of change of the voltage of said tank capacitor,
wherein said controller is arranged to count a number of consecutive closing cycles of said second switch needed for an average of several measured values of the voltage of said tank capacitor to reach or exceed a predetermined voltage level.

2. The device according to claim 1, wherein the capacitance of said sensor capacitor is smaller than or equal to 1 nF when said object is far away from said sensor.

3. The device according to claim 1, wherein the capacitance of said tank capacitor is greater than or equal to 10 times the capacitance of said sensor capacitor.

4. The device according to claim 3, wherein the capacitance of said tank capacitor is greater than or equal to 100 times the capacitance of said sensor capacitor.

5. The device according to claim 1, wherein said controller is arranged to count a number of consecutive closing cycles of said second switch needed for the voltage of said tank capacitor to reach or exceed a predetermined voltage level.

6. The device according to claim 1, wherein a predetermined voltage level is arranged to be adjusted based on a previous measurement value.

7. The device according to claim 1, wherein said measurement value is a time constant.

8. The device according to claim 1, wherein said measurement value is a voltage of said tank capacitor attained after a predetermined charging period.

9. The device according to claim 8, wherein the length of said predetermined charging period is arranged to be adjusted based on a previous measurement value.

10. The device according to claim 1, wherein said controller or a further computer is arranged to determine a difference between a first measurement value corresponding to a first capacitance value of said sensor capacitor and a second measurement value corresponding to a second capacitance value of said sensor capacitor.

11. The device according to claim 1, wherein the switching frequency of said second switch is arranged to be adjusted based on a previous measured value.

12. The device according to claim 1, wherein the distance between said first capacitive element and said tank capacitor is smaller than or equal to 0.5 m.

13. The device according to claim 1, further comprising:
a second capacitor; and
a third switch to couple the second capacitor to the tank capacitor to adjust the capacitance of the tank capacitor.

14. A device for capacitively detecting an object, said device comprising:
a capacitive sensor having a sensor capacitor formed between at least one first capacitive element and at least one second capacitive element such that a presence of said object can change a capacitance of said sensor capacitor,
a voltage supply,
a first switch to couple said sensor capacitor to said voltage supply in order to charge said sensor capacitor,
a tank capacitor having an adjustable capacitance,
a second switch to couple said sensor capacitor to said tank capacitor in order to transfer charge from said sensor capacitor to said tank capacitor and to change the voltage of said tank capacitor,
at least one switch driver unit to control said charging and charge transfer by opening and closing said switches several times such that said switches are not in the closed state simultaneously,
a voltage monitoring unit to monitor the voltage of said tank capacitor, and
a controller to determine at least one measurement value which depends on the rate of change of the voltage of said tank capacitor
a second capacitive sensor corresponding to an additional sensor capacitor such that the presence of said object can change the capacitance of said additional sensor capacitor,
a first additional switch to couple said additional sensor capacitor to a voltage supply in order to charge said additional sensor capacitor,
an additional tank capacitor,
a second additional switch to couple said additional sensor capacitor to said additional tank capacitor in order to transfer charge from said additional sensor capacitor to said additional tank capacitor and to change the voltage of said additional tank capacitor,
at least one switch driver unit to control said charging and charge transfer by opening and closing said additional switches several times such that said additional switches are not in the closed state simultaneously,
a voltage monitoring unit to monitor a difference between the voltage of said tank capacitor and the voltage of said additional tank capacitor, and
a controller to determine at least one measurement value which depends on the difference between the rate of change of the voltage of said tank capacitor and the rate of change of the voltage of said additional tank capacitor.

15. A method for capacitively detecting an object by using a capacitive sensor having a sensor capacitor formed between at least one first capacitive element and at least one second capacitive element such that a presence of said object can change the capacitance value of said sensor capacitor, said method comprising:

charging said sensor capacitor by coupling the sensor capacitor to a voltage supply, wherein said voltage supply is disconnected from a tank capacitor during said charging, transferring charge from said sensor capacitor to a tank capacitor, wherein said voltage supply is disconnected from said tank capacitor during said charge transfer, repeating said charging and charge transferring several times, adjusting a capacitance of the tank capacitor, monitoring the voltage of said tank capacitor, determining at least one measurement value which depends on a rate of change of the voltage of said tank capacitor, and counting a number of consecutive closing cycles of a switch needed for an average of several measured values of the voltage of said tank capacitor to reach or exceed a predetermined voltage level.

16. The method according to claim 15, wherein said sensor capacitor has been installed in or on a floor such that a distance between the tank capacitor and the surface of the floor is smaller than or equal to 50 mm.

17. The method according claim 15, wherein adjusting the capacitance of the tank capacitor comprises coupling a second capacitor to the tank capacitor with a switch.

18. A device for capacitively detecting an object, said device comprising:
a capacitive sensor having a sensor capacitor formed between at least one first capacitive element and at least one second capacitive element such that a presence of said object can change a capacitance of said sensor capacitor;
a voltage supply;
a first switch to couple said sensor capacitor to said voltage supply in order to charge said sensor capacitor;
a tank capacitor;
a second switch to couple said sensor capacitor to said tank capacitor in order to transfer charge from said sensor capacitor to said tank capacitor and to change the voltage of said tank capacitor;
at least one switch driver unit to control said charging and charge transfer by opening and closing said switches several times such that said switches are not in the closed state simultaneously;
a voltage monitoring unit to monitor the voltage of said tank capacitor; and
a controller to determine at least one measurement value which depends on the rate of change of the voltage of said tank capacitor,
wherein said controller is arranged to count a number of consecutive closing cycles of said second switch needed for the average of several measured values of the voltage of said tank capacitor to reach or exceed a predetermined voltage level.

19. A device for capacitively detecting an object, said device comprising:
a capacitive sensor having a sensor capacitor formed between at least one first capacitive element and at least one second capacitive element such that a presence of said object can change a capacitance of said sensor capacitor;
a voltage supply;
a first switch to couple said sensor capacitor to said voltage supply in order to charge said sensor capacitor;
a tank capacitor;
a second switch to couple said sensor capacitor to said tank capacitor in order to transfer charge from said sensor capacitor to said tank capacitor and to change the voltage of said tank capacitor;
at least one switch driver unit to control said charging and charge transfer by opening and closing said switches several times such that said switches are not in the closed state simultaneously;
a voltage monitoring unit to monitor the voltage of said tank capacitor;
a controller to determine at least one measurement value which depends on the rate of change of the voltage of said tank capacitor;
a second capacitive sensor corresponding to an additional sensor capacitor such that the presence of said object can change the capacitance of said additional sensor capacitor;
a first additional switch to couple said additional sensor capacitor to a voltage supply in order to charge said additional sensor capacitor;
an additional tank capacitor;
a second additional switch to couple said additional sensor capacitor to said additional tank capacitor in order to transfer charge from said additional sensor capacitor to said additional tank capacitor and to change the voltage of said additional tank capacitor;
at least one switch driver unit to control said charging and charge transfer by opening and closing said additional switches several times such that said additional switches are not in the closed state simultaneously;
a voltage monitoring unit to monitor a difference between the voltage of said tank capacitor and the voltage of said additional tank capacitor; and
a controller to determine at least one measurement value which depends on the difference between the rate of change of the voltage of said tank capacitor and the rate of change of the voltage of said additional tank capacitor.

20. A method for capacitively detecting an object by using a capacitive sensor having a sensor capacitor formed between at least one first capacitive element and at least one second capacitive element such that a presence of said object can change the capacitance value of said sensor capacitor, said method comprising:
charging said sensor capacitor by coupling the sensor capacitor to a voltage supply, wherein said voltage supply is disconnected from a tank capacitor during said charging;
transferring charge from said sensor capacitor to a tank capacitor, wherein said voltage supply is disconnected from said tank capacitor during said charge transfer;
repeating said charging and charge transferring several times;
monitoring the voltage of said tank capacitor;
determining at least one measurement value which depends on a rate of change of the voltage of said tank capacitor; and
counting a number of consecutive closing cycles of a switch needed for an average of several measured values of the voltage of said tank capacitor to reach or exceed a predetermined voltage level.

* * * * *

UNITED STATES PATENT AND TRADEMARK OFFICE
CERTIFICATE OF CORRECTION

| | |
|---|---|
| PATENT NO. | : 8,531,193 B2 |
| APPLICATION NO. | : 12/668569 |
| DATED | : September 10, 2013 |
| INVENTOR(S) | : Petri Välisuo et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 788 days.

Signed and Sealed this
Tenth Day of February, 2015

Michelle K. Lee
*Deputy Director of the United States Patent and Trademark Office*